United States Patent [19]

Olsen et al.

[11] Patent Number: 5,163,833
[45] Date of Patent: Nov. 17, 1992

[54] DUAL PERSONAL COMPUTER ARCHITECTURE PERIPHERAL ADAPTER BOARD

[75] Inventors: Derek S. Olsen, San Jose; Richard D. Cavaness, Fremont; Gail R. Snyder, San Jose, all of Calif.

[73] Assignee: Digital Communications Associates, Inc., Alpharetta, Ga.

[21] Appl. No.: 781,510

[22] Filed: Oct. 22, 1991

Related U.S. Application Data

[62] Division of Ser. No. 339,186, Apr. 14, 1989.

[51] Int. Cl.⁵ .............................................. H05K 7/10
[52] U.S. Cl. .................................... 439/61; 361/413; 439/79; 439/170
[58] Field of Search ............. 439/59, 61, 62, 170–173, 439/65, 79, 80; 361/399, 413, 415, 427; 364/708

[56] References Cited

U.S. PATENT DOCUMENTS

| | | |
|---|---|---|
| 3,993,936 | 11/1976 | Meade et al. |
| 4,287,563 | 9/1981 | Huston, Jr. ........................ 364/200 |
| 4,291,370 | 9/1981 | Charles ............................. 364/200 |
| 4,309,754 | 1/1982 | Dinwiddie, Jr. .................... 364/200 |
| 4,443,846 | 4/1984 | Adcock ............................. 364/200 |
| 4,447,878 | 5/1984 | Kinnie et al. ...................... 364/200 |
| 4,473,755 | 9/1984 | Imani et al. ....................... 307/10.1 |
| 4,575,793 | 3/1986 | Morel et al. ....................... 364/200 |
| 4,885,482 | 12/1989 | Sharp et al. ....................... 307/465 |
| 4,901,205 | 2/1990 | Landis et al. ..................... 361/413 |
| 4,936,785 | 6/1990 | Krug et al. ........................ 439/75 |

FOREIGN PATENT DOCUMENTS

| | | |
|---|---|---|
| 08801008 | 9/1988 | Belgium. |
| 0350573 | 1/1990 | European Pat. Off. |
| 3808364 | 9/1989 | Fed. Rep. of Germany. |

OTHER PUBLICATIONS

IBM Bulletin, Bardo, vol. 20, No. 1, p. 89, Jun. 1977.
IBM Technical Disclosure Bulletin, vol. 31, No. 5, Oct. 1988, pp. 131–132, Armonk, NY, entitled "Adapter Card for Personal Computer".
D. Erlin, "Establishing the Micro-to-Mainframe Connection"; Computer Design, vol. 23, No. 2, Feb. 1984, pp. 231–236.
Excerpt from Devlonics Terminals N.V. modem card user manual; 1988.

*Primary Examiner*—Neil Abrams
*Attorney, Agent, or Firm*—Jones, Askew & Lunsford

[57] ABSTRACT

A peripheral adapter board and circuit which is capable for operation with two different personal computer bus architectures is disclosed. The preferred peripheral function for the board and circuit is a terminal emulator, which allows a personal computer into which the board is plugged to function as a terminal for a mainframe or minicomputer. Edge connectors or contacts are provided on opposite side edges of the board; each one of the edge connectors is compatible with a different computer bus. The adapter board may be flipped over to plug into either computer bus. A removable, repositionable connector board assembly is provided at one end of the board, for mounting communications connectors in a position accessible from the back panel of a host personal computer. The connector board may be repositioned to maintain the orientation of the communications connectors with respect to the personal computer back panel when the adapter board is flipped over to plug into a different computer bus. Circuitry is provided for detecting the particular computer bus into which the adapter board is plugged, and for providing appropriate address, data, and control signals associated with the selected computer bus.

29 Claims, 12 Drawing Sheets

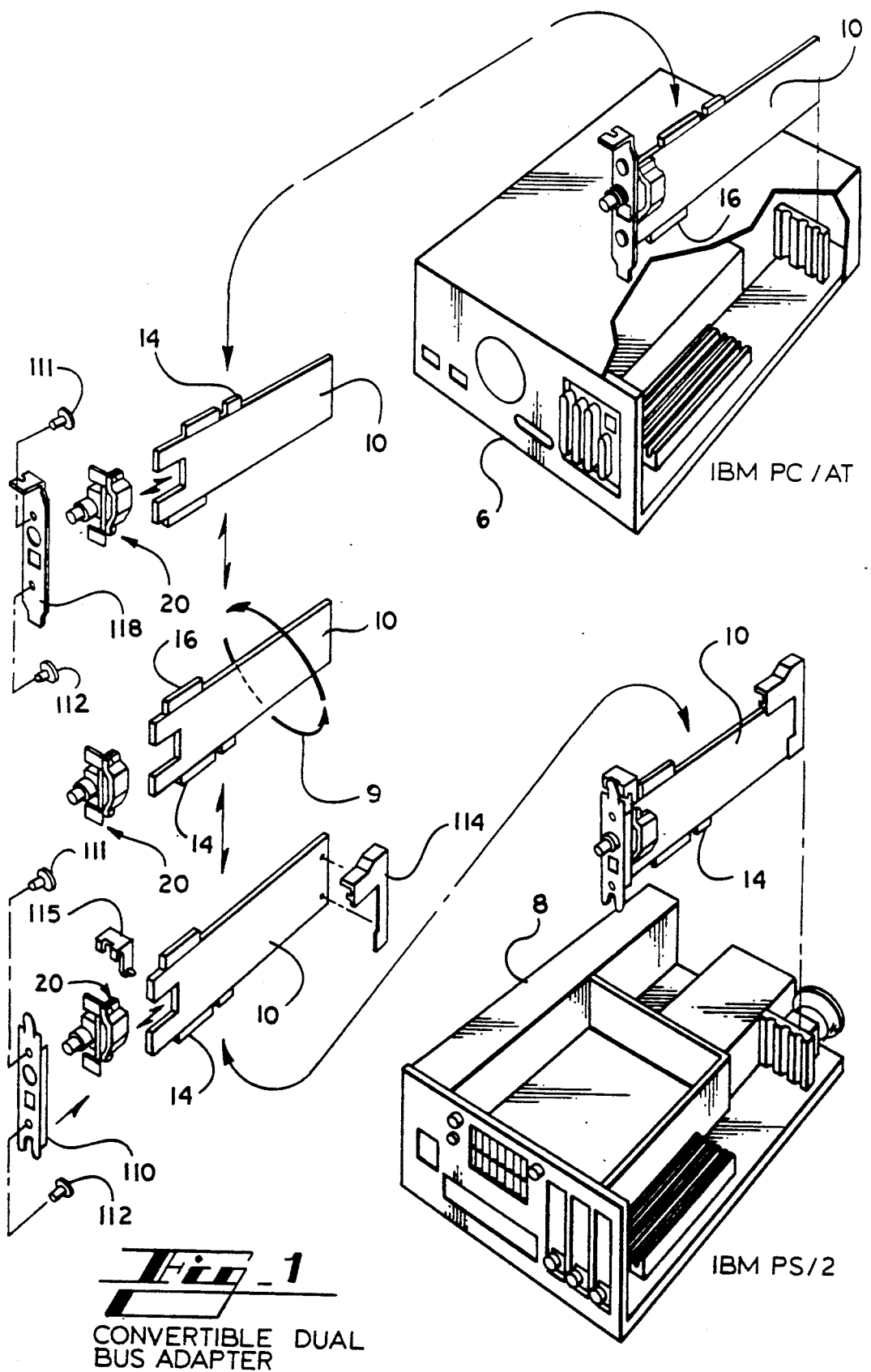
Fig_1
CONVERTIBLE DUAL BUS ADAPTER

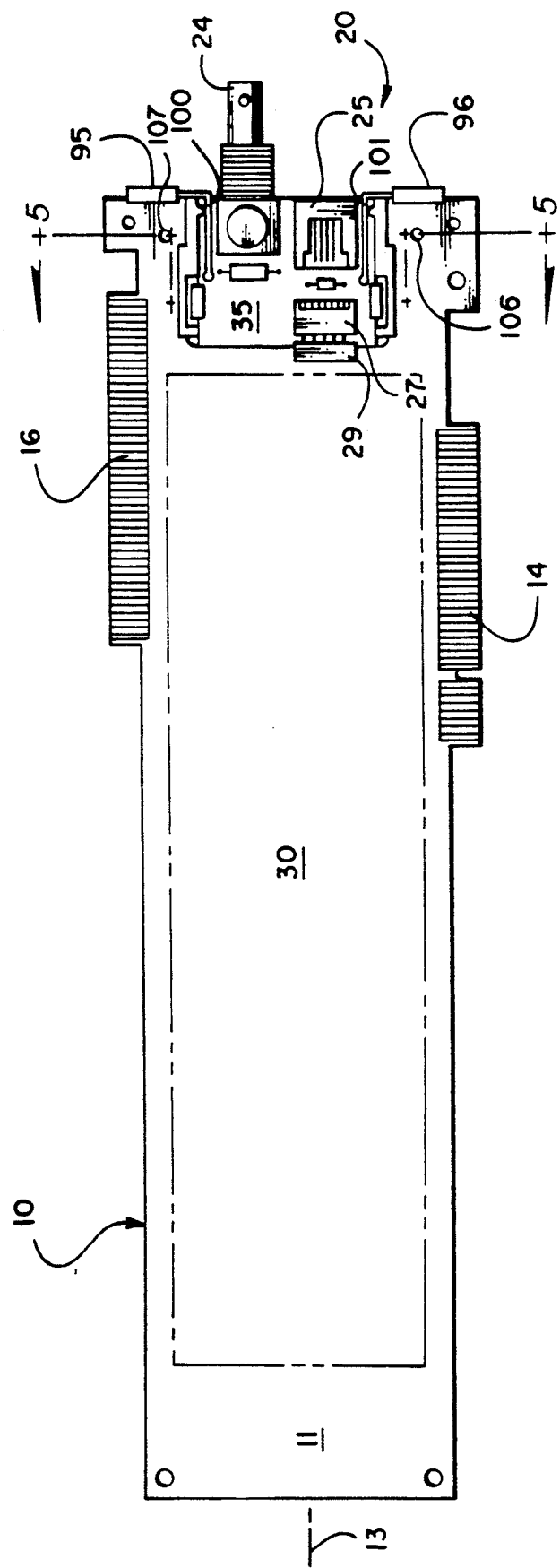

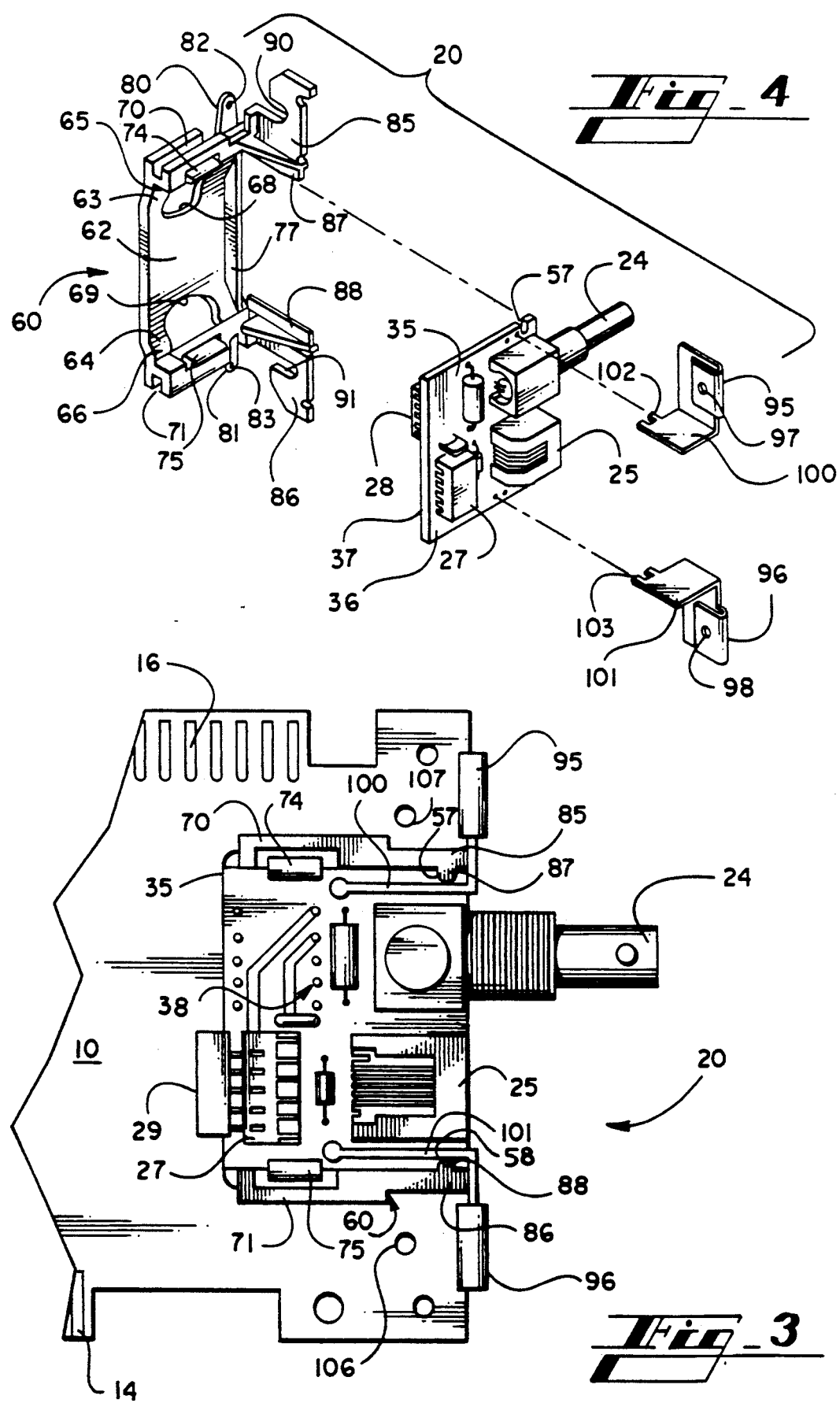

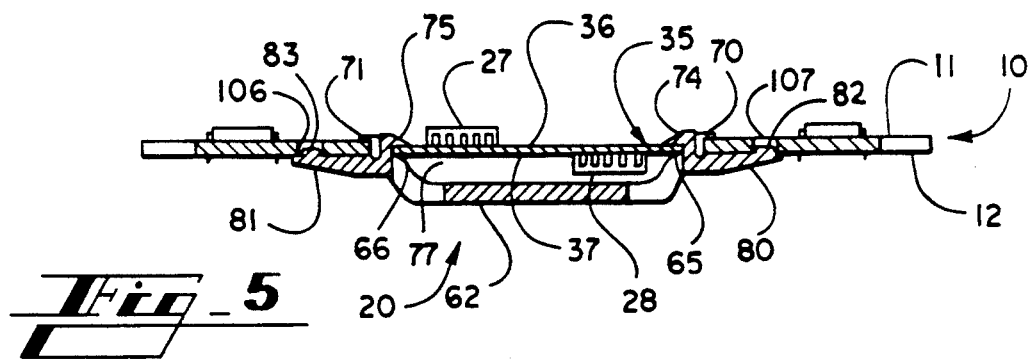
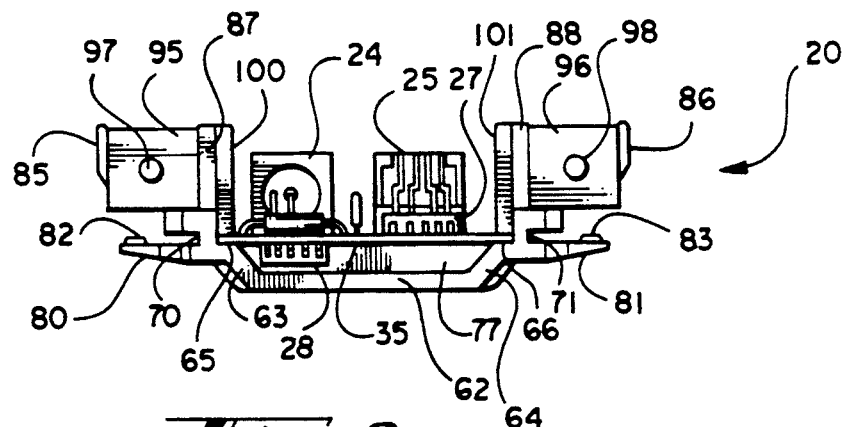
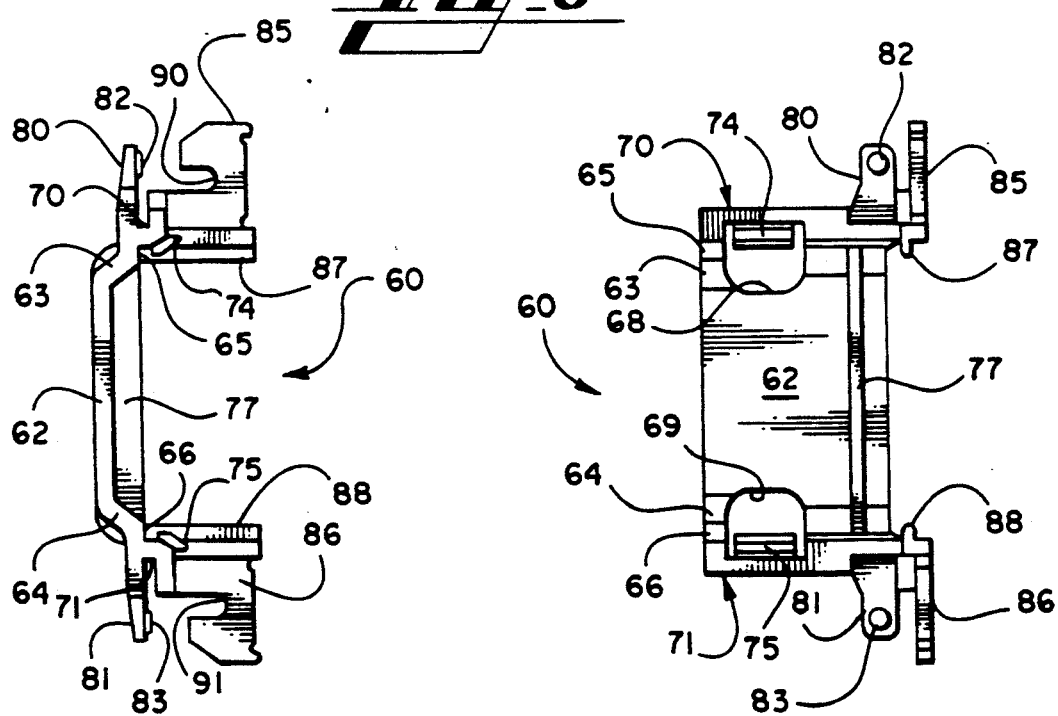

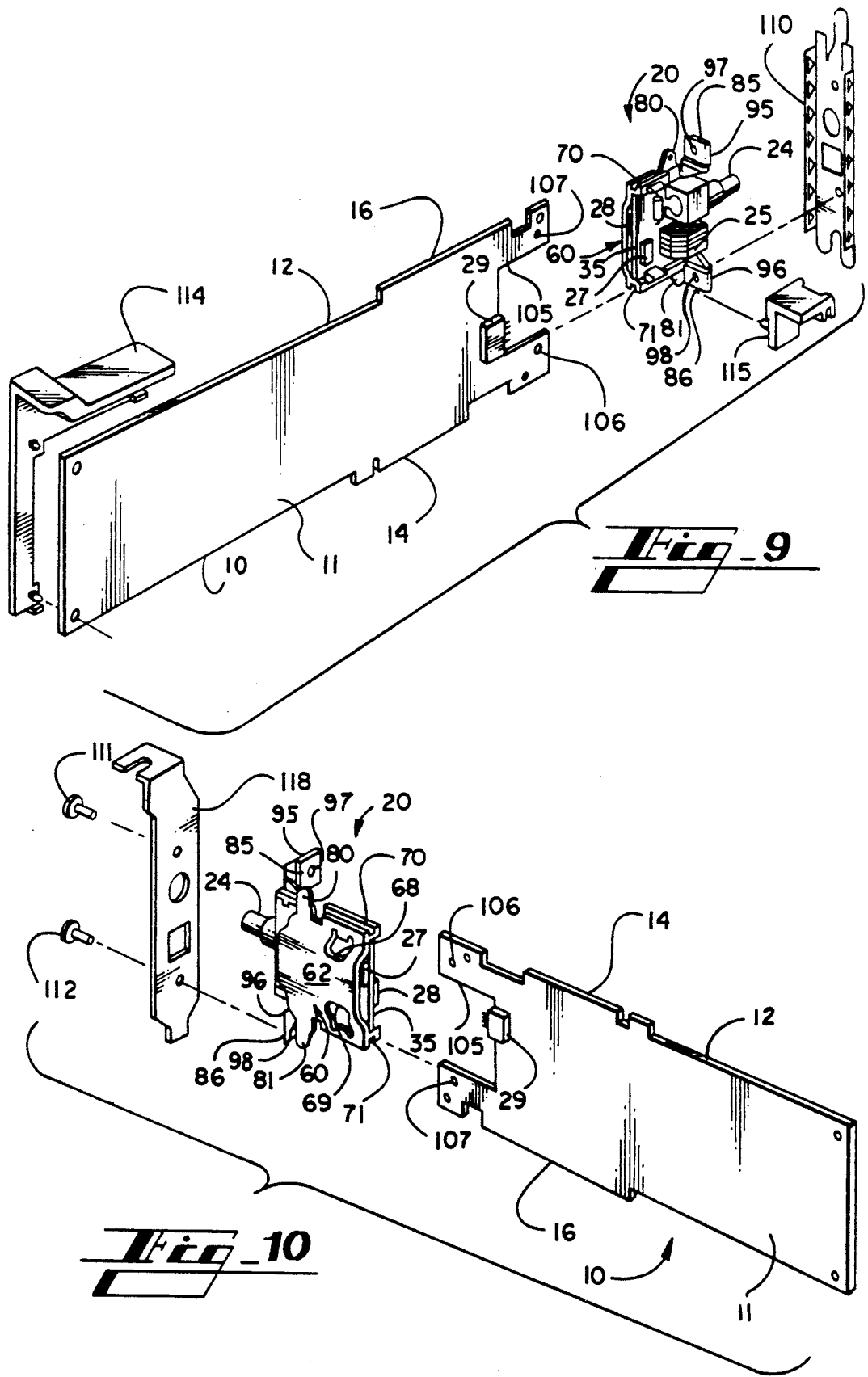

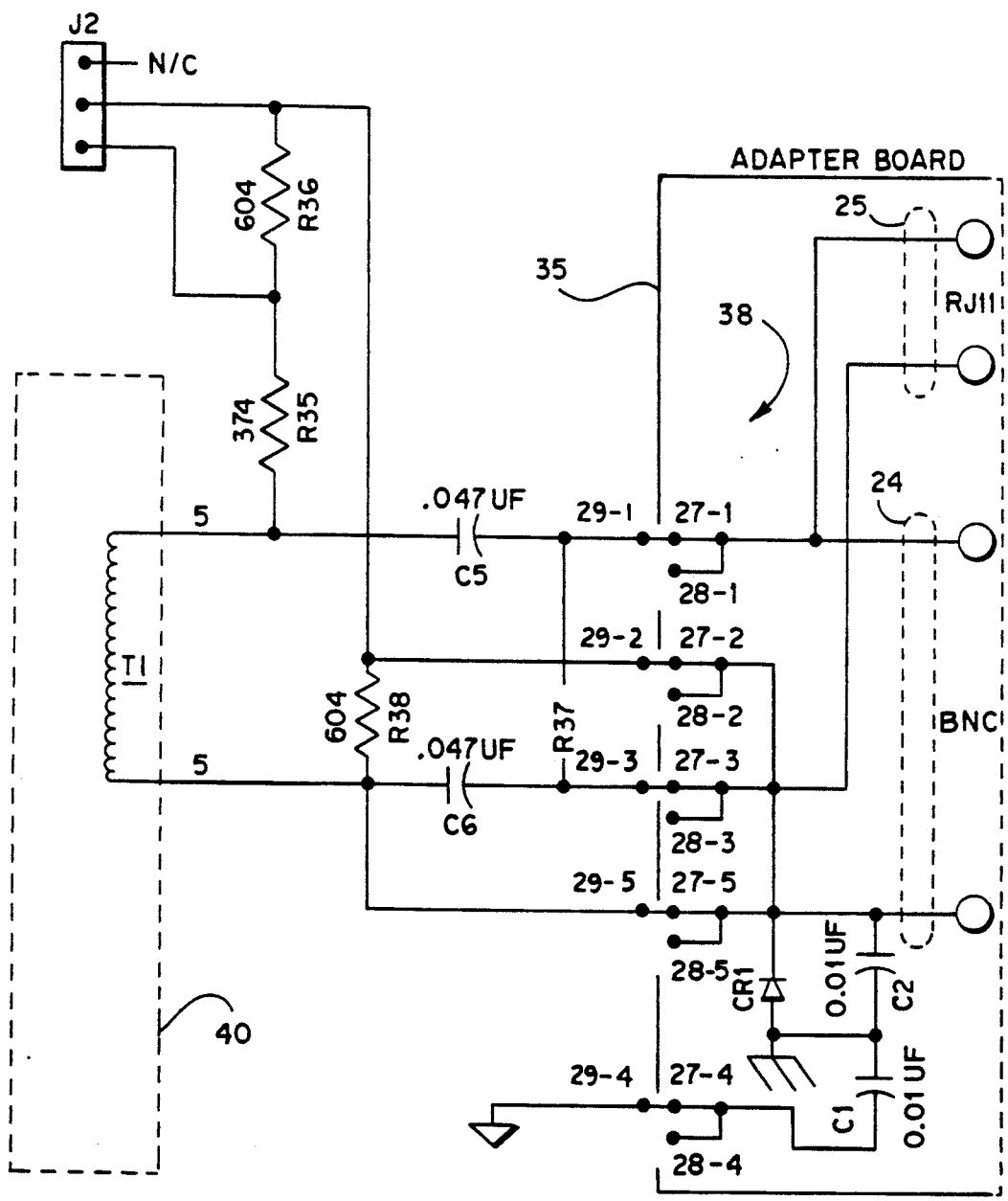
Fig_11

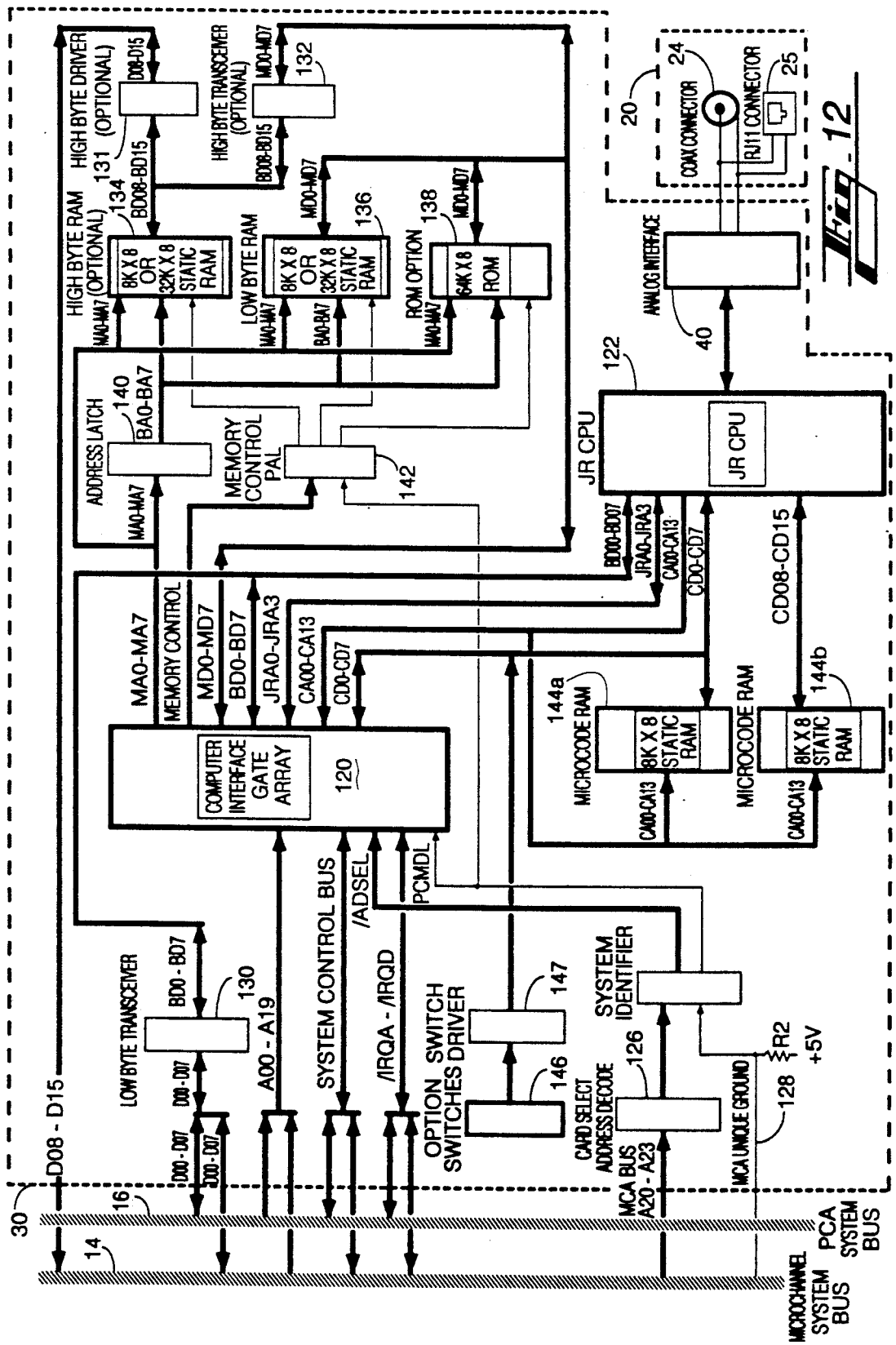

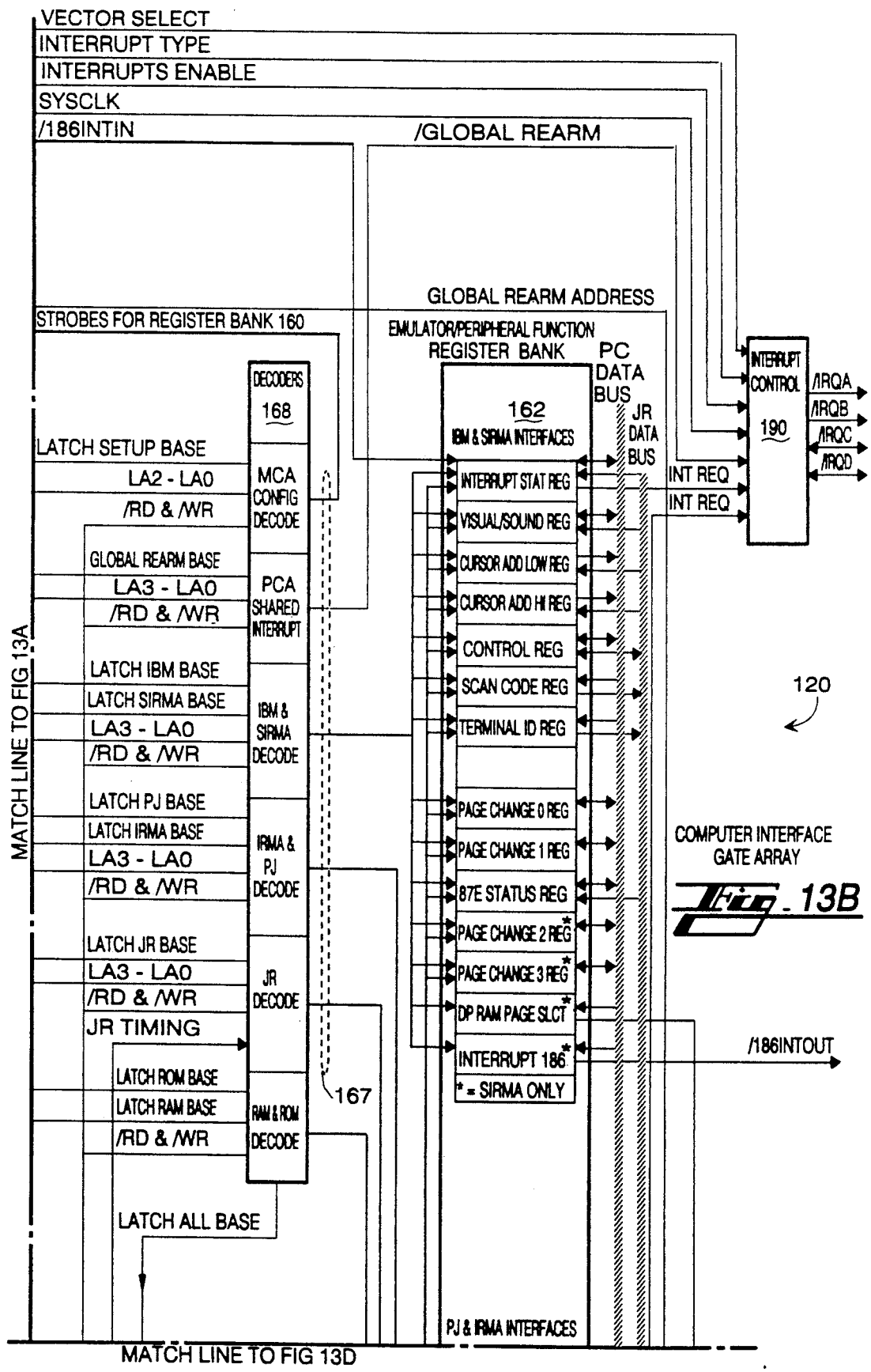

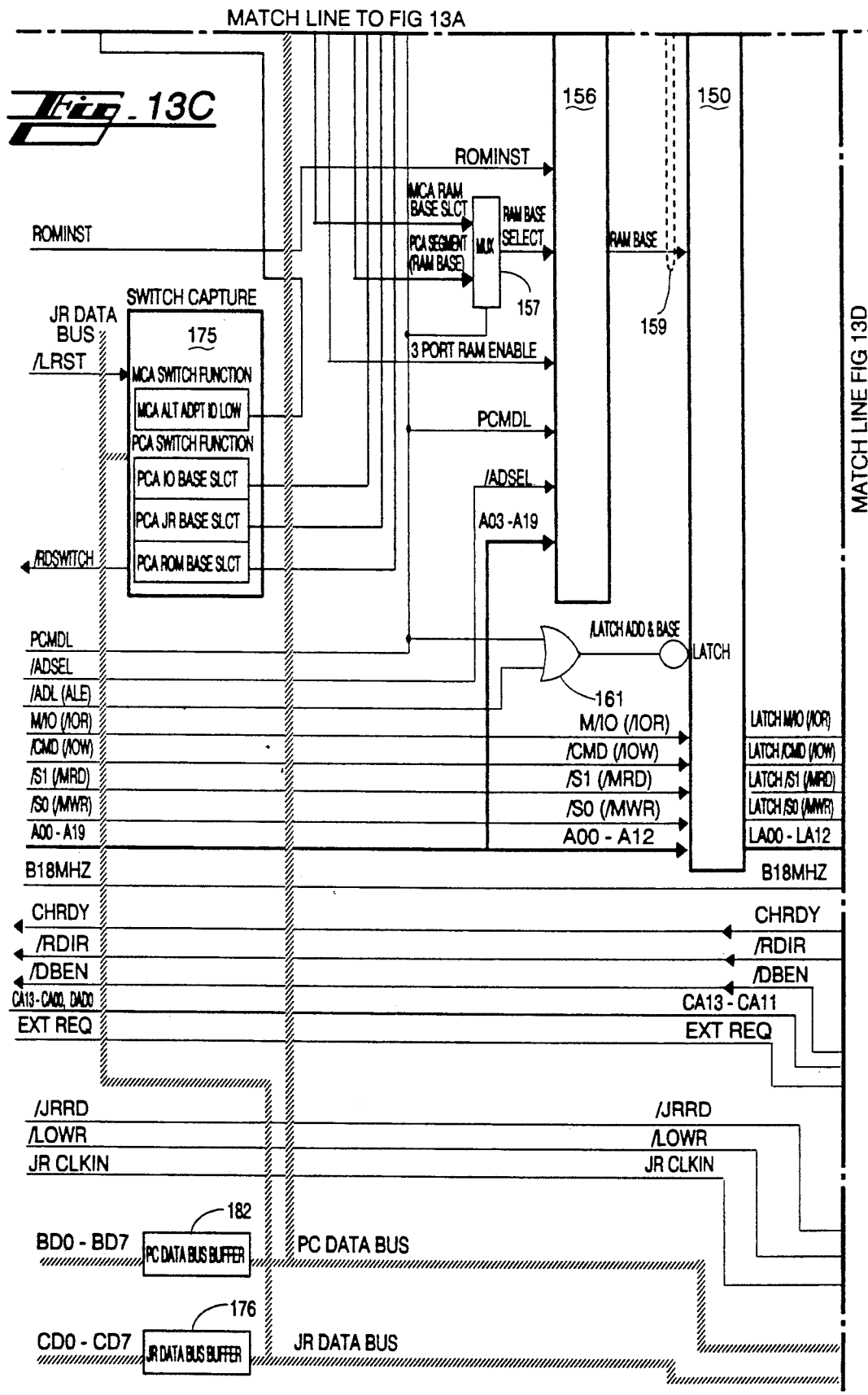

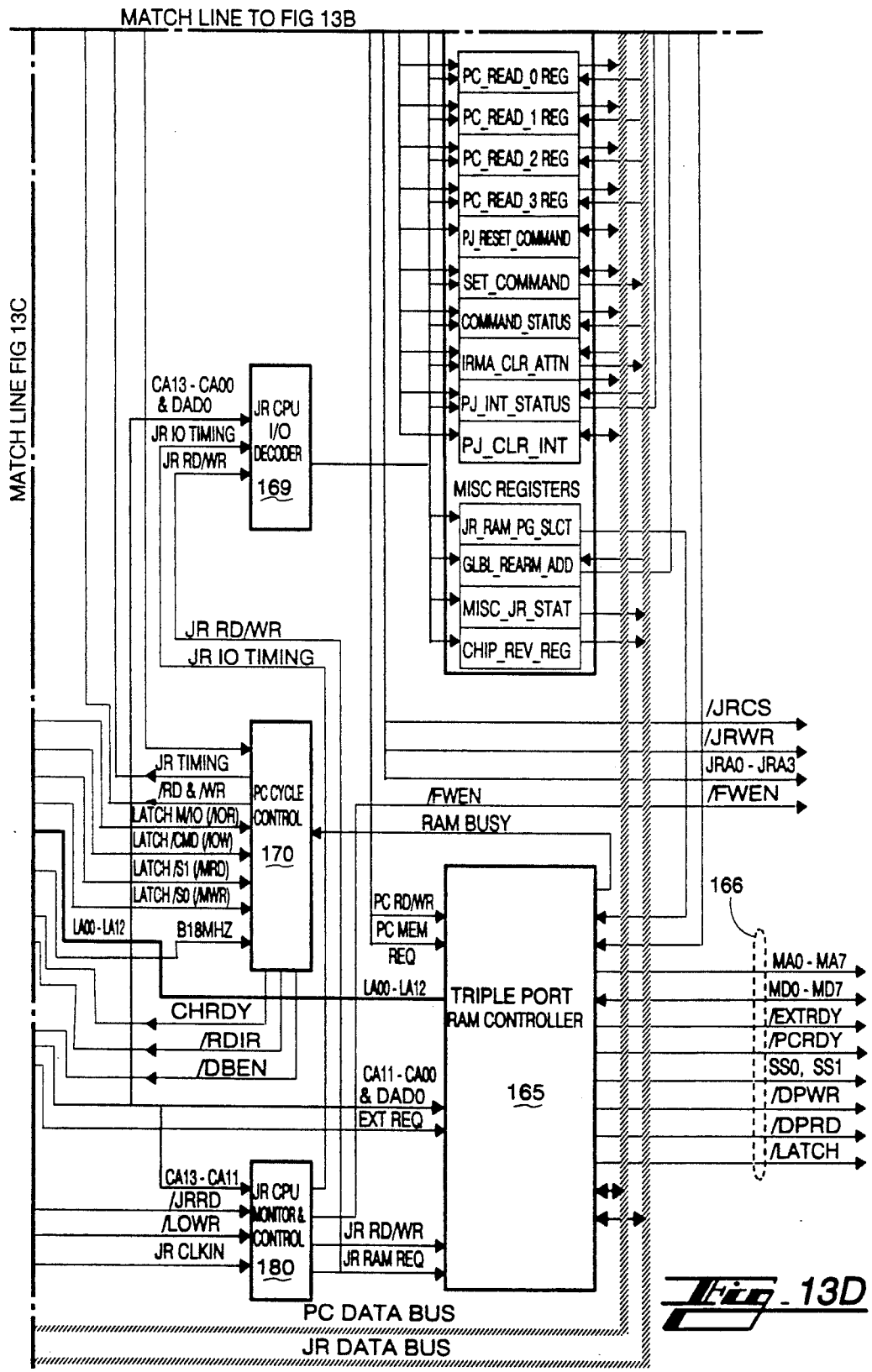

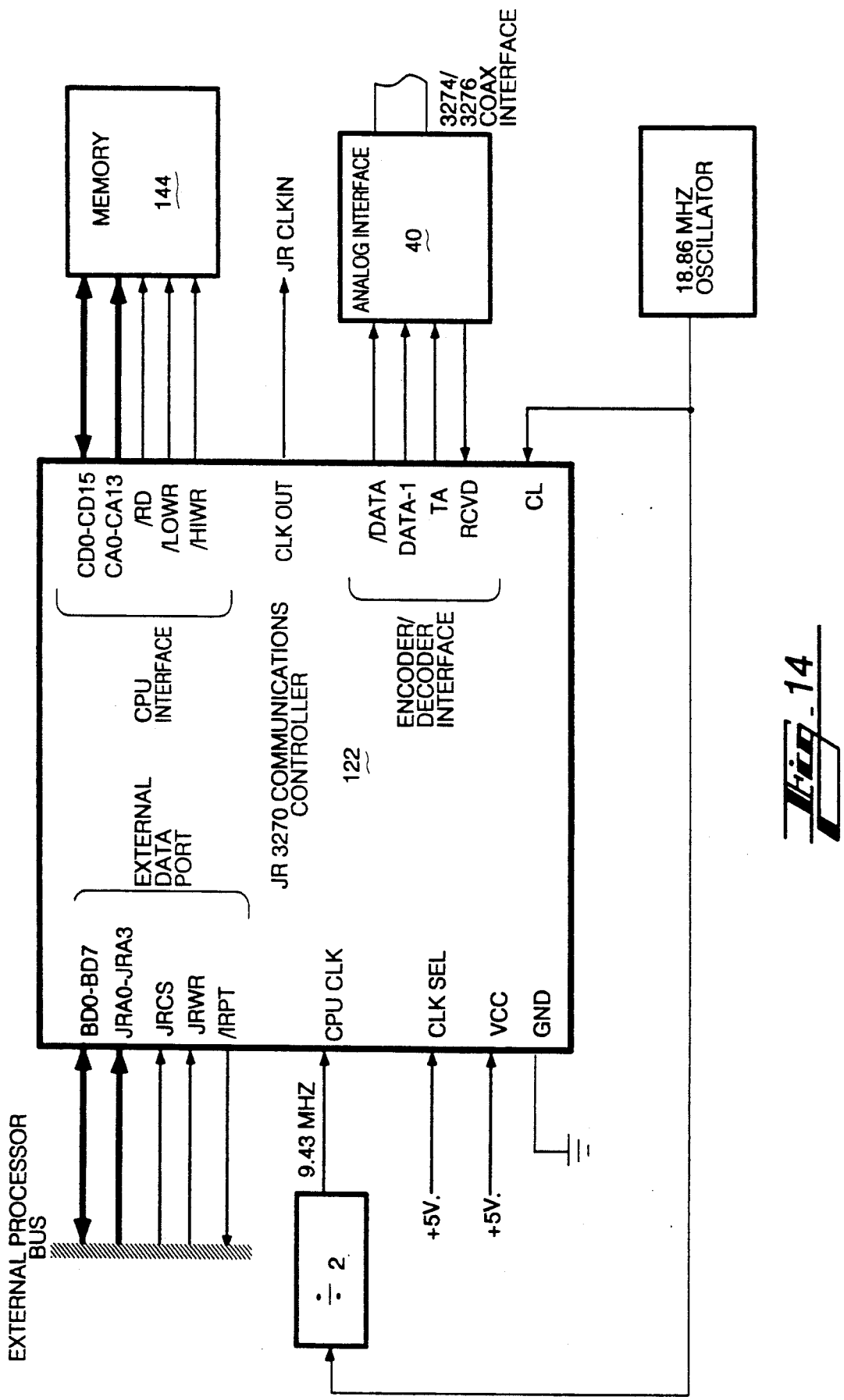

DUAL PERSONAL COMPUTER ARCHITECTURE PERIPHERAL ADAPTER BOARD

CROSS REFERENCE TO RELATED APPLICATION

This is a division of application Ser. No. 07/339,186, filed Apr. 14, 1989, by Olsen et al., entitled "Dual Personal Computer Architecture Peripheral Adapter Board and Circuit".

TECHNICAL FIELD

The present invention relates to peripheral adapter boards of the type which fit into expansion slots associated with personal computers, and more particularly relates to a terminal emulator peripheral adapter board capable of operation with two discrete computer bus architectures.

BACKGROUND OF THE INVENTION

Owners and operators of personal computers regularly must face the fact that changes in computer technology move beyond the technology embodied in a particular machine in which they have invested. As computer manufacturers advance to new generations of equipment, they often change to a new bus architecture. An example is the adoption of Micro Channel Architecture (MCA) by International Business Machines Corporation (IBM) for use in IBM PS/2 personal computers, to replace the widely popular Personal Computer Architecture (PCA) previously used in IBM PC , PC XT, and PC AT computers. Peripheral device interface circuits embodied in adapter cards provided with edge contacts compatible with the PCA system cannot be used with the MCA system, and conversely.

Thus, a user who is considering upgrading to a new generation of computer technology which employs a different bus architecture must replace not only the central processing unit, but all of the peripheral device interface adapters purchased for use in connection with the earlier machine. This may include terminal emulators for communicating with mainframe computers, modems, memory expansion cards, graphics adapters, printer interfaces, and the like. If, for example, a coporation decides to provide terminal emulation capability for a large group of personal computers to enable them to communicate with the corporation's mainframe computer, the purchase of an adapter board for each of the personal computers is usually required. However, if the corporation also is considering upgrading the personal computers to machines with a different, perhaps more advanced, bus architecture, it faces a dilemma. If the needed capability is immediately purchased, it may have to be purchased again in the form of new adapter boards compatible with the new bus architecture. If the corporation postpones upgrading to the new bus architecture, it will be sacrificing the needed terminal emulation capability during the interim period.

Another aspect of the difficulties faced by personal computer users and owners is the current competition between the MCA personal computer bus and the Extended Industry Standard Architecture (EISA) personal computer bus. Certain manufacturers of "clones" of the popular IBM PCA bus architecture have recently embarked upon a course of action to promote the 32-bit EISA bus as an alternative to the MCA bus. The EISA bus is being promoted at least partly to postpone the obsoletion of older 8-bit PC bus adapter cards and 16-bit PC/AT adapter cards, as well as to provide an upgrade path to a 32-bit architecture which is compatible with at least some existing interface adapters. Many computer installations will inevitably wind up with a mix of MCA machines, PCA machines, EISA machines, and perhaps even other personal computer architectures such as the NuBus architecture. The proliferation of bus architectures has created a need for interface adapter boards for personal computers which increases flexibility in moving the boards from computer to computer for upgrades, enhancements, replacement, and the like.

A related problem faced by owners is computer inventory or asset maintenance and control. The need to provide a different peripheral adapter for each different type of personal computer utilized, even though the basic functions of the peripheral adapters may be the same, makes the tasks of selecting, acquiring, storing, maintaining, and repairing a large number of different peripheral adapters unnecessarily complicated. It would be more efficient if a single function peripheral adapter were operative in more than one computer bus architecture.

Accordingly, there is a need in the computer industry for an adapter board that is compatible with and can be plugged into more than one type of computer bus architecture.

SUMMARY OF THE INVENTION

The present invention solves the aforementioned and other problems in the art discussed above by providing an adapter board capable of operation with either of two discrete computer bus architectures. The preferred adapter board is operable in at least two different computer bus architecture environments: the IBM PC/AT environment, now commonly referred to as the Personal Computer Architecture (PCA) environment, and the PS/2 environment, now commonly referred to as the Micro Channel Architecture (MCA).

An adapter board embodying the present invention includes two different bus connector means, each associated with one of the two architectures, PCA and MCA, and circuit means for interfacing between the two different bus architectures and a peripheral function. The disclosed peripheral function is a terminal emulator function. The terminal emulator functions which are accessible to personal computer applications or drivers (e.g., the known IRMA, PJ, IBM, and the like emulator drivers) comprise both hardware resources such as input/output ports and a display RAM, as well as microcoded services provided by a microprocessor which is dedicated for 3270 protocol handling functions.

Although in the preferred embodiment the adapter board comprises a terminal emulator, other types of peripheral functions may be implemented. Accordingly, the present invention is not limited to a terminal emulator, and will also be useful for peripheral functions such as memory expansion board, data acquisition circuits, graphics adapters, modems, etc.

The preferred embodiment is a 3270-type emulation adapter which provides an IBM PC or compatible personal computer or an IBM PS/2 model personal computer with an interface to IBM 3270 control units, thereby allowing the personal computers to emulate IBM 3278 and 3279 display stations, or an IBM 3287 printer. As will be understood by those skilled in the art, in the 3278/3279 emulation mode, the circuit appears to a mainframe computer to be a 3278 or 3279 display station.

In order to receive communications from a mainframe control unit or cluster controller, the preferred embodiment includes external communication connectors for electrical connection and communication with remote devices. The preferred external connector is provided on a removable, dual position connector board assembly which is movable between a first position with respect to the adapter board and a second position with respect to the board. Thus, the adapter board may be used with either of the bus architectures and the external connector board, and its associated communications connectors, may be positioned to be compatible with the particular bus architecture to which the board is connected while still maintaining physical alignment with openings in the back panel of the computer housing or cabinet.

It will be appreciated that the preferred bus connector means comprise electrical edge contacts compatible with the expansion slots of the respective bus architectures. In the preferred embodiment disclosed below, the external communications connector may be a BNC type coaxial connector, an RJ-11 connector, or both.

More particularly described, the invention provides a computer adapter board including a main circuit board, and external communication connector means for enabling the board to be connected to a device located off the board, with the connector means being mounted on a removable section of the main circuit board. The removable section is received in either of two orientations by the main board, so as to place the external connector means in either of two orientations. In the preferred embodiments, the removable section is slidably received within an area cut out of the main board. The removable section preferably includes two connectors, one of which will be positioned to engage a mating connector on the main board in either of the two orientations of the removable section.

It will thus be seen that a computer user considering a future upgrade to a new computer with a different bus architecture could purchase a needed adapter board embodying the present invention and have compatibility with both the old and new bus architectures. The user thus will not have to replace several expensive adapter boards when upgrading the underlying system, and can merely reconfigure the adapter board for the new architecture when the new computer is acquired.

Thus, it is an object of the present invention to provide a more versatile peripheral circuit adapter board for computers.

It is a further object of the present invention to provide an improved adapter board capable of operation with at least two discrete bus architectures.

It is a further object of the present invention to provide an improved peripheral function adapter board and circuit for use with a plurality of different computer bus architectures, having an improved bus interface circuit for interfacing to the different computer bus architectures.

It is a further object of the present invention to provide an improved peripheral function adapter circuit for use with a plurality of different computer bus architectures which makes economical use of circuit components and board real estate by consolidating bus interface functions common to both bus architectures.

It is a further object of the present invention to provide an adapter board capable of operation with either of two discrete computer bus architectures while presenting the same configuration of external connectors associated with the board.

It is a further object of the present invention to provide a terminal emulator board or card that can be used with a personal computer having a PCA bus architecture or with a different personal computer having an MCA bus architecture.

Other objects, features and advantages will become apparent upon review of the following detailed description of the preferred embodiment of the invention, when taken in conjunction with the drawing and the appended claims.

BRIEF DESCRIPTION OF THE DRAWINGS

FIG. 1 is a schematic perspective of an IBM PC/AT personal computer and an IBM PS/2 Model 50 personal computer, showing the removal of an adapter board constructed in accordance with the present invention from one of the computers and reconfiguration for use in the other computer.

FIG. 2 is a side plan view of the component side of an adapter board embodying the invention, assembled for use with an MCA computer bus architecture, without card holder, retainer, and backplate.

FIG. 3 is a detailed side plan view of a removable and repositionable external communication connector board which forms a part of the preferred embodiment shown in FIG. 2.

FIG. 4 is an exploded perspective view of the removable connector board shown in FIG. 3.

FIG. 5 is a vertical cross-sectional view taken along line 5—5 of FIG. 2.

FIG. 6 is a side plan view of a holder which retains the removable connector board of FIG. 3.

FIG. 7 is an end plan view of the holder of FIG. 6.

FIG. 8 is an end plan view of the removable connector board assembly.

FIG. 9 is an exploded perspective view of the main circuit board, the removable assembly and hardware used to interface the adapter board with an MCA bus architecture.

FIG. 10 is an exploded perspective view of the main circuit board, removable connector board assembly, and hardware used to interface the adapter board with a PCA bus architecture.

FIG. 11 is a schematic diagram of the circuitry of the removable connector board, connecting the external communication connectors to the main circuit board.

FIG. 12 is a schematic block diagram of the preferred embodiment of a dual computer bus interface circuit which is provided on the main circuit board for interfacing the adapter to a plurality of different computer bus architectures.

FIG. 13 comprising FIGS. 13A-13D, is a more detailed schematic block diagram of the computer interface gate array which is employed in the computer bus interface circuit shown in FIG. 12.

FIG. 14 is a more detailed schematic block diagram of of the JR CPU which is employed in the computer bus interface circuit shown in FIG. 12 to effectuate 3270 communications.

DETAILED DESCRIPTION OF THE PREFERRED EMBODIMENT

Figure 13A:
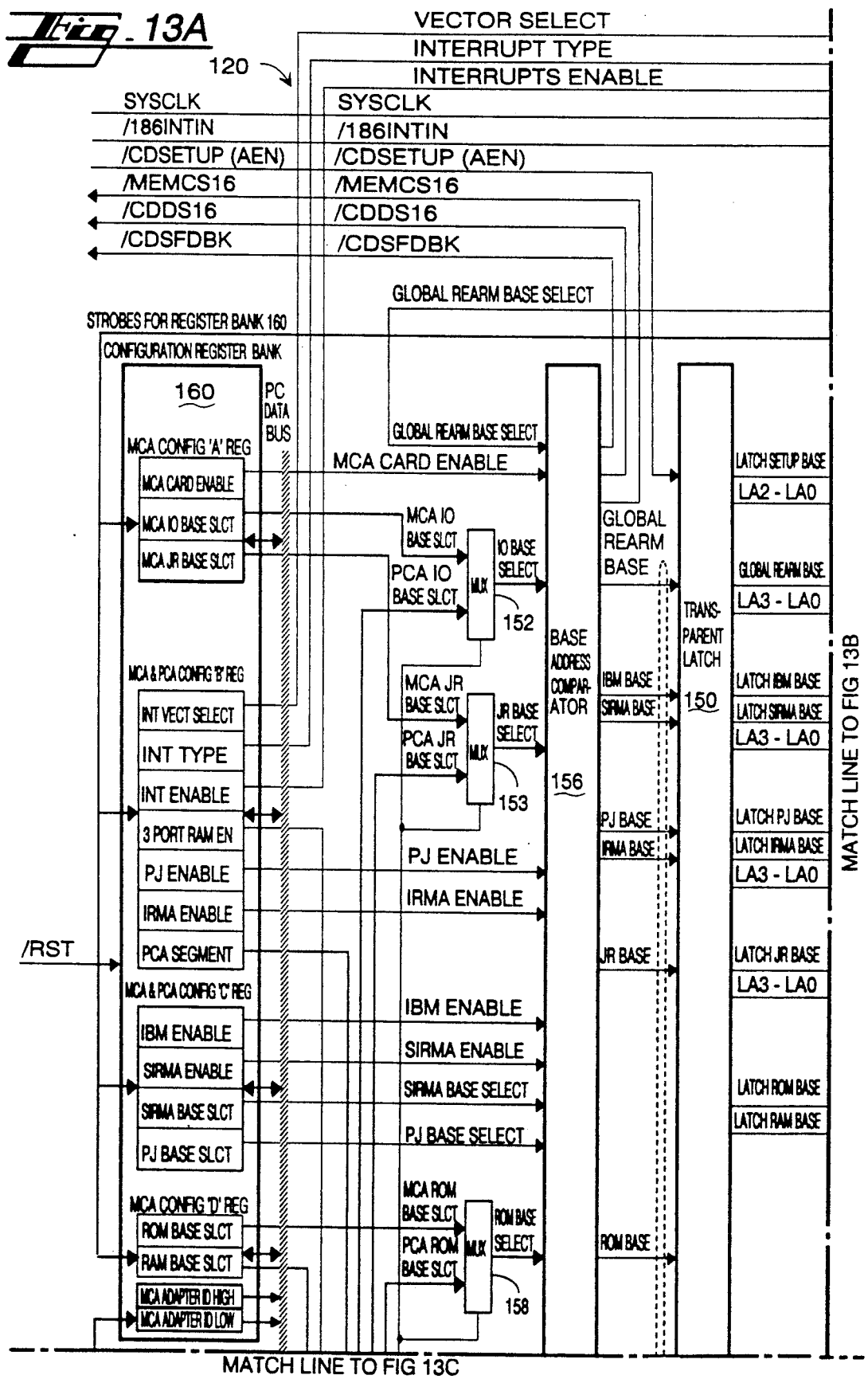

Referring now to the drawings, in which like numerals refer to like parts throughout the several views, FIG. 1 shows an IBM PC/AT personal computer 6, with the preferred embodiment of the present invention, a dual bus computer interface adapter board 10 configured for use in such a computer architecture, being removed therefrom. The adapter board 10 is reconfigured for use in an IBM PS/2 Model 50 personal computer 8 by removing thumbscrews 111, 112, removing a PCA backplate 118, removing a removable connector board assembly 20, flipping the board 10 over in the direction of arrows 9 so that the MCA edge connector 14 is downwardly disposed and the PCA edge connector 16 is upwardly disposed, reinserting the removable connector board assembly 20, attaching MCA card holder 114 and card retainer 115, attaching an MCA backplate 110 with the thumbscrews 111, 112, and inserting the reconfigured board 10 into the computer 8.

FIG. 2 shows a plan view of the dual bus computer interface adapter board 10 embodying the present invention, configured for an MCA computer bus architecture. The main adapter board 10 includes a component side 11, shown in FIG. 2, and a solder side 12 (see FIG. 10). The board 10 has a longitudinal axis of symmetry represented by a dashed line 13. Along the bottom edge of the board as viewed in FIG. 2, the board 10 includes a series of MCA edge contacts 14, which are arranged to be plugged into an expansion slot in a computer using MCA bus architecture. A set of PCA edge contacts 16 for a PCA expansion slot are positioned along the top of the board 10, generally opposite the MCA edge contacts.

The preferred embodiment of a dual bus interface adapter 10 disclosed herein operates to configure a personal computer into which the adapter is plugged into a terminal emulator for a mainframe computer, although other computer interface functions will become apparent to those skilled in the art. Accordingly, circuitry 30 is provided on the board 10 for executing the terminal emulator peripheral function. Although in the preferred embodiment, the adapter board circuitry 30 comprises a terminal emulator, it should be understood that other types of peripheral functions may be implemented. Thus, the circuit 30 may be a memory expansion circuit, a color graphics monitor driver/adapter, a data acquisition circuit, a modem, a disk drive or tape drive controller, or any of a number of other computer peripheral functions.

The disclosed embodiment is a 3270-type emulation adapter which provides an IBM PC/AT or compatible personal computer or an IBM PS/2 MCA or compatible model personal computer with an interface to IBM 3270 control units, thereby allowing the personal computers to emulate IBM 3278 and 3279 display stations, or an IBM 3287 printer. The communication link is established over a conventional IBM category A coaxial cable at distances at up to 5,000 feet utilizing external communications connector 24, or a conventional IBM type 3 twisted pair cable at distances at up to 1,000 feet utilizing external communications connector 25. For further information about the 3270 protocols, see the IBM documents entitled "IBM 3270 Connection Technical Reference," IBM document number GA23-0339-0 or "IBM 3174/3274 Control Unit to Device Product Attachment Information (PAI)" dated October 1986.

The preferred adapter circuit includes an on-board dedicated processor denominated the JR CPU (described below in connection with the preferred circuitry 30) for managing the 3270 communications functions, which thereby off-loads the host personal computer from the real-time processing requirement of communication protocol. It accepts and executes commands from both a 3270-type control unit and from the PC. It accordingly assists the personal computer in establishing a 3270 mainframe session through cluster controllers such as IBM type 3274, 3276, and 3174 control units, and IBM 4321, 4331, 4361 and 4701 systems.

In the present invention, various terminal emulator modes are implemented with programming in the JR CPU. Operation in a selected mode provides what is known as a "programming interface", that is, a predetermined set of parameters, commands, and registers needed by a software driver in the host PC to allow the software driver to effectuate operation in a particular emulator mode. The associated programming interfaces which are operative with the present invention employ resources provided on the preferred adapter board 10.

Several different industry standard terminal emulation programming interfaces or modes may be implemented with the preferred embodiment, allowing the use of currently popular micro-to-mainframe software. Such interfaces include the known IRMA, PJ, and IBM Advanced Adapter interfaces. For further information on these programming interfaces, see the IBM document entitled "Technical Referenced for the Advanced Adapter", IBM document number GA23-0302-1. See also the Digital Communications Associates, Inc. document entitled DCA IRMA 2 Technical Reference Guide, document number 40-97920-000, published by the assignee of the present invention.

Inasmuch as these types of terminal emulation modes will be known to those skilled in the art, further discussion of same will not be provided herein, other than to say that the disclosed adapter is programmed to implement such mainframe terminal emulation interfaces.

As discussed above, the preferred adapter board 10 is operable in at least two different computer bus architecture environments: the IBM PC/AT environment, now commonly referred to as the Personal Computer Architecture (PCA) environment, and the PS/2 environment, now commonly referred to as the Micro Channel Architecture (MCA). The terminal emulator functions which are accessible to personal computer applications or drivers (e.g., IRMA, PJ, IBM Advanced Adapter, and the like) comprise both hardware resources such as input/output ports and a display or "multi port" RAM, as well as microcoded services provided by the dedicated JR microprocessor.

As will be understood by those skilled in the art, in the 3278/3279 emulation mode, the circuit appears to a mainframe computer to be a 3278 or 3279 display station. The circuit decodes and executes commands from a control unit or cluster controller, to cause updating of a display buffer located on the board and to process keystrokes. The preferred adapter board includes enough display buffer memory to accommodate IBM 327X screen models 2 through 5, and to support the IBM Extended Attribute Buffer (EAB) for each model. Software which executes on the personal computer stimulates the adapter board circuit 30 to transfer a copy of the display buffer to the personal computer video board when screen updates occur. Keystrokes from the personal computer's keyboard are submitted to the adapter circuit, and the adapter 10 sends them to the control unit in the appropriate protocol.

Another mode of operation is the 3287 mode. In this mode, the preferred circuit described herein appears to be a 3287 printer to a control unit. The adapter circuit decodes and executes commands from the control unit that similarly update the display or print buffer and solicits printer status. The display buffer is used by the circuit to buffer print data and a control block. Software executing on the personal computer moves a copy of the buffered print data to a printer attached to the personal computer and acknowledges print completion or a printing error.

Yet another mode of operation possible with the disclosed embodiment is known as the DFT mode, wherein the adapter circuit appears to be a gateway to an intelligent workstation. The adapter circuit decodes and executes commands from a control unit and updates a display buffer. The display buffer is used to buffer a 3270 data stream commands and communication status. These commands may be addressed to a plurality of logical displays and a printer. Such intelligent workstations are capable of processing 3270 data streams, managing formatted display screens, and handling local keystroke processing.

These and other modes of operation may occur to those skilled in the art after the discussion which follows.

Referring still to FIG. 2, in order to communicate with a cluster controller (such as an IBM 3274, 3276, or 3174 Control Unit) or other control unit, an external communications connector comprising a removable connector board assembly 20 is fitted into the main adapter board 10 at the rear end of the board (the right side of the board 10 in FIG. 2). The removable connector board assembly 20 may be associated with the board 10 in either of two orientations, as explained in detail below. The connector board assembly 20, being configured as a terminal emulation adapter circuit, carries two external connectors in the preferred embodiment—a coaxial connector 24 and an RJ11 connector 25—which are accessible from the back panel of the computer when the board 10 is installed in an expansion slot. The connector board assembly 20 also includes a pair of female multi-pin header connectors 27 and 28 (see FIG. 4) positioned for one of them to receive the pins of a corresponding male multi-pin connector 29 located on the main board 10 when the connector board assembly 20 is installed into the main board 10.

Processing of communications between the cluster controller or other control unit and the personal computer into which the preferred adapter 10 is plugged, including protocol decoding and encoding, maintenance of display memory, etc., are effectuated through circuit 30, which is described later.

As shown in FIGS. 3 and 4, the removable connector board assembly 20 includes a removable printed circuit board section 35 and a holder 60 which supports the removable board 35 and enables it to be inserted or removed from its installed relationship to the main board 10. The board 35 has a component side 36 and a solder side 37. The external communications connectors 24 and 25 noted above are positioned along the rear edge of the board 35, such that the female portion of the coaxial/BNC connector 24 extends beyond the edge of the main board when the removable connector board assembly 20 is installed as shown in FIGS. 2 and 3. The RJ11 connector 25 is a female connector positioned to extend beyond the rear edge of the main board 10. The female terminal connectors 27 and 28 are positioned at the rear edge of the removable board 35, with the connector 27 on the component side 36 and the connector 28 on the solder side 37. The connectors 27, 28 are identical, so that either of them can mate with the male connector 29, depending upon the orientation of the connector board assembly 20. As the removable connector board assembly 20 is changed between its two possible orientations, the particular one of the female connectors 27 and 28 which is on the component side 11 of the main board is located directly adjacent to the male connector 29.

The removable board 35 also includes circuitry 38 for connecting the BNC external communications connector 24 and the RJ11 external connectors connector 25 to the two separate five-pin connectors 27 and 28, as shown in FIG. 11, and then to an analog interface circuit 40 on the adapter 10. The analog interface circuit 40 comprises a conventional circuit known for use in 3270 communications, and will not be described further herein. The circuitry 38 comprises a parallel connection between the active or signal-carrying terminals of the RJ11 connector 25 and the BNC connector 24. The active or signal-carrying terminals are provided as pins 27-1 and 28-1, signal return is provided on the pins 27-2, 28-2, 27-3, 28-3, 27-5, 28-5, while DC ground is provided on pins 27-4, 28-4. These pins mate with respective pins 29-1, 29-2, 29-3, 29-4, and 29-5 of the male connector 29. A transient voltage absorber CR1 such as as General Instruments 1N6267 and filter capacitors C1, C2 provide for noise filtering between DC ground and chassis/frame ground in the known manner.

Incoming communications signals are applied to connectors 24, 25, coupled through capacitor C5 and brought to a pulse transformer T1 in the analog interface circuit 40, which passes the difference between the two signal lines through to a voltage comparator (not shown) for conversion to TTL levels. Outgoing communications signals are applied to a separate winding of T1, passed through capacitor C5, and applied to connectors 24, 25 and the external cable. Received data decoding is performed by receiver logic internal to the JR CPU 122, described in connection with FIG. 12. Encoding of the transmitted data is performed by transmitter logic also internal to the JR CPU 122. A jumper J2 allows for connection of terminating resistors R35 or R36 between the terminals of the pulse transformer T1, depending upon whether the RJ11 or BNC connection is used, for impedance matching of the transformer circuit to the requirements of the communications lines connected.

Turning now to FIGS. 3 and 4, it will be seen that a pair of notches 57 and 58 are formed in the top and bottom edges, respectively, of the removable board 35 of the connector board assembly 20, near the front edge thereof. These notches assist in locating the board 35 with respect to the holder 60, which is shown in FIGS. 3-8. The holder 60 is preferably molded from a unitary piece of non-conductive plastic material which may be one of several appropriate types known to those skilled in the art. A planar base 62 is formed with a pair of angled walls 63 and 64 extending out of the plane of the base 62 along opposite edges thereof. The angled walls 63 and 64 end in a pair of ledges 65 and 66, respectively. As shown in FIGS. 5 and 8, the removable board 35 rests on the ledges 65 and 66 spaced apart in relation to the base 62, with the female 5-pin connector 28 extending into the space between the base 62 and the board 35.

A pair of U-shaped tracks 70 and 71 are provided in the holder 60 extending adjacent to the ledges 65 and 66. The tracks open away from the center of the holder 60 in the plane of the board 35, and are just wide enough to slidably receive the main board 10, in a manner described below. A pair of cutouts 68 and 69 are provided in the angled walls 63 and 64 and the base 62 to permit movement of the resilient latches 74 and 75, which extend above the ledges 65 and 66. As shown best in FIG. 5, these latches 74, 75 define a bevelled surface and can be urged outwardly during installation of the removable board 35, whereupon they spring back over the upper and lower edges of the board 35 to hold it in place.

The holder 60 also defines a transverse support wall 77 extending between the angled walls 63 and 64 between the cutouts 68 and 69 and the front edge of the holder 60. The support wall rises from the base 62 to a height even with that of the ledges 65 and 66, and helps both to give rigidity to the holder 60 and to prevent the board 35 from bowing toward the base 62.

Near the front edge of the holder 60, a pair of locking tabs 80 and 81 extend outwardly from the holder at the level of the ledges 65 and 66 to a position beyond the tracks 70 and 71. The tabs 80 and 81 carry detents 82 and 83, respectively, which project slightly into the plane of the main board 10, as shown in FIG. 5, to catch in openings in the main board as described below, and retain the connector board assembly 20 in place. The thickness of the tabs 80 and 81, and the resilient nature of the plastic material, should be such that the tabs can flex by at least the height of the detents 82 and 83.

At the two rear corners of the holder 60, a pair of posts 85 and 86 extend at right angles away from the base 62 on the concave side of the holder 60. A pair of flanges 87 and 88 extend inwardly along the inner edges of the posts 85 and 86. The flanges 87 and 88 are shaped and spaced apart to matingly receive the notches 57 and 58 provided in the removable board 35. The posts 85 and 86 also define cutout slots 90 and 91 positioned to align with holes in a standard backplate, as described below.

A pair of conductive U-shaped grounding clips 95 and 96 are fitted onto the extending ends of the posts 85 and 86. The clips 95 and 96 define openings 97 and 98 which align with the slots 90 and 91 on the holder 60 and threadably receive standard thumbscrews as described below. The clips 95 and 96 include extensions 100 and 101 that wrap around the flanges 87 and 88 of the posts 85 and 86, and define pin sets 102 and 103 which are soldered or press fit to the removable board 35 as shown in FIG. 4.

To assemble the removable connector board assembly 20, one needs the parts shown in FIG. 4, namely, the removable board section 35, the holder 60, and the grounding clips 95 and 96. The clips 95 and 96 may initially be soldered or press fit to the board 35 after placing the pin sets 102 and 103 in appropriate openings in the printed circuit board 35. Then, the board 35 and the holder 60 are moved together until the notches 57 and 58 engage the flanges 87 and 88. The board 35 slides along the flanges 87 and 88 until it meets the bevelled surfaces of the resilient latches 74 and 75. Pressure is exerted on the board 35 to cause its edges to move the latches outwardly, allowing the board 35 to move past the latches until it rests against the ledges 65 and 66, whereupon the latches spring back above the board 35 and hold it firmly against the ledges and the support wall 77. Lateral movement of the board 35 is confined by the flanges 87 and 88, and by the inner walls of the tracks 70 and 71, which extend above the level of the ledges 65 and 66. As the the board moves toward the ledges, the U-shaped clips 95 and 96 slide over the posts 85 and 86, and when the board 35 is fully installed, the openings 97 and 98 are aligned with the cutouts 90 and 91 of the posts.

Referring now to FIG. 9, the main adapter board 10 defines a generally square cutout 105 shaped to matingly receive the removable connector board assembly 20. The cutout 105 is centered on the axis of symmetry 13 (FIG. 2) and opens to the rear edge of the main board 10. Holes 106 and 107 are formed in the main board adjacent to the cutout 105 to receive the detents 82 and 83 of the locking tabs 80 and 81 of the holder 60.

The removable connector board assembly 20 may be assembled with the main board 10 in either of two configurations, shown in FIGS. 9 and 10. To install the removable connector board for operation with an MCA architecture, the tracks 70 and 71 are aligned with the top and bottom edges of the cutout 105, with the component side 36 of the removable board 35 facing the same direction as the component side 11 of the main board 10. Then, the tracks 70 and 71 are slid onto the main board. When the detents 82 and 83 engage the rear edge of the main board 10, the tabs 80 and 81 flex to allow the detents to slide over the solder side surface of the board 10. The removable assembly is moved into the main board 10 until the pins of the male terminal 29 insert into the sockets of the female terminal connector 27, and the detents 82 and 83 enter the holes 106 and 107. The fully installed MCA configuration is shown in FIGS. 2, 3, and 9.

To install the MCA configured adapter board 10 into a computer, the MCA card holder 114 and card retainer 115 are snapped onto the board 10. An MCA backplate 110 is secured to the board by aligning the holes in the backplate with the openings 97 and 98 in the grounding clips 95 and 96. The backplate 110 is secured by threading a pair of thumbscrews 111 and 112 through the openings in the backplate and into the openings 97 and 98. Other openings in the backplate allow the coaxial connector 24 to extend through the backplate, and allow access to the RJ11 connector 25. The board is now ready to be inserted into the computer with the edge contacts 14 engaging an MCA expansion slot (not shown).

It should be understood that the MCA card holder 114 and card retainer 115 are not standard IBM MCA card holders and retainers. The standard IBM-type card holders and retainers are permanently attached to standard IBM MCA printed circuit boards by rivets, whereas the preferred card holder 114 and card retainer 115 employed in the present invention are removable so as to allow removal and reconfiguration of the board for use in a PCA environment.

To reconfigure the board for a computer utilizing a PCA architecture, the thumb screws 111 and 112 are removed, then the MCA backplate 110, card holder 114, and card retainer 115 are removed. The removable connector board assembly 20 then may be grasped and pulled outwardly, sliding the tracks 70, 71 along the edges of the cutout 105 while disengaging the female connector 27 away from the male connector 29, and dislodging the detents 82 and 83 from the holes 106 and 107. When the removable connector board assembly 20 is clear of the main board 10, it is rotated 180 degrees so that the solder side 37 (FIG. 4) of the removable board 35 and the base 62 of the holder face in the same direction as the component side 11 of the main board 10, as shown in FIG. 10. The removable connector board assembly 20 may then be slid onto the main board within the cutout 105 in the same manner as described above. The detents 82 and 83 move along the component side surface of the main board 10, and enter the holes 106 and 107 from the opposite side as previously described. The female connector 28 is now aligned with the male connector terminal 29, and the two become coupled as the connector board assembly 20 reaches its fully inserted position (not shown).

Still referring to FIG. 10, to install the PCA configured adapter board 10 into a computer, a PCA backplate 118 is secured to the board by aligning the holes in the backplate with the openings 97 and 98 in the grounding clips 95 and 96. The backplate 118 is secured by threading the thumbscrews 111 and 112 through the openings in the backplate and into the openings 97 and 98. The board 10 is then ready to be inserted into the computer with the edge contacts 16 engaging a PCA expansion slot (not shown).

It thus will be seen that when the removable connector board assembly 20 is changed from an MCA orientation to a PCA configuration, and conversely, the external communications connectors 24 and 25 change from positions extending above the component side of the main board 10 to positions extending above the solder side of the main board. Since the coaxial connector 24 and the RJ11 connector 25 are on opposite sides of the axis of symmetry 13 (see FIG. 2), they also exchange positions with respect to the axis of symmetry 13 when the configuration of the removable assembly 20 is switched.

It will also be appreciated that the mechanical reconfigurability of the preferred adapter board described above can easily be adapted for use with other types of peripheral devices and connectors for purposes other than a terminal emulator, while still remaining within the scope of the present invention. For example, if the adapter 10 is employed as a graphics interface for a high resolution RGB monitor, a monitor cable connector (not shown) may be mounted on the connector board assembly 20, and the connector repositioned with respect to the back of the computer cabinet to maintain alignment with openings in the back. It will be therefore be appreciated that the present invention is operable with a wide variety of personal computer peripheral functions.

Preferred Circuitry

Inasmuch as the disclosed embodiment of the present invention of a dual computer architecture peripheral adapter comprises a terminal emulator as the peripheral function, next will be described the preferred interface circuitry for interfacing two different personal computer architectures, the PCA architecture and the MCA architecture, to a terminal emulator peripheral function. Turning in this regard to FIG. 12, the preferred circuitry 30 for interfacing the adapter board to the PCA and MCA computer architectures is shown, with the particular peripheral function of providing a terminal emulation circuit for effectuating 3270 emulation protocols. The preferred interface circuit 30 is constructed around a computer interface gate array 120 and a dedicated microprocessing circuit or CPU 122, designated the JR CPU, for carrying out 3270 protocol functions. Signals constituting 3270 communications are received via the BNC/coax connector 24 or the RJ11 connector 25 at an analog interface circuit 40, which is connected for communications with the JR CPU 122.

As will be understood by those skilled in the art, peripheral device interfaces for different computer buses such as the MCA bus 14 and the PCA bus 16 typically carry out many of the same basic functions, namely, receiving address information from address signals, decoding the address signals to determine if the particular peripheral circuit is being addressed by a host CPU, receiving and transmitting data signals, generating and processing interrupts, timing to accommodate the various cycles on the buses, and performing other types of computer system control functions. While there are various (and often substantial) differences between the MCA bus and the PCA bus, including but not limited to the pinouts of the bus connectors and the physical dimensions of the contacts on the edge connectors, there are nonetheless similarities.

The present invention capitalizes on the similarities between functions common to both bus architectures. Significant efficiencies in usage of board real estate and components are obtained in the present invention by providing computer interface functions common to both buses and providing services to both buses through a custom VLSI computer interface gate array 120, while still allowing for the differences between the buses. The computer interface gate array 120 performs most of computer interface services and functions common to both the PCA and the MCA bus.

Referring in this regard to FIG. 12, the address lines A00-A19 of both the MCA bus 14 and the PCA bus 16 are provided to the computer interface gate array 120 for decoding. Since the MCA bus 14 includes more address lines than the PCA bus, the address lines A20-A23 of the MCA bus are provided to a card select address decode circuit 126 for decoding whether the particular adapter card 10 is being addressed on the MCA bus. The output of the decoder 126 is a signal denominated /ADSEL, which becomes low true when the particular adapter is addressed on the MCA bus. (Note: for purposes of the following discussion, a slash "/" preceding a signal name signifies a low true signal.)

The determination of whether the PCA bus 16 or the MCA bus 14 is active is made by signal denominated MCA UNIQUE GROUND, provided on line 128. This signal, also denominated PCMDL, is derived from one of the pins of the MCA bus 14 which is grounded only when the adapter is plugged into an MCA bus; the line is pulled up to five volts by a pullup resistor R2, so that if the adapter board is plugged into a PCA bus 16, the signal PCMDL will be high. The PCMDL signal accordingly identifies which of the two different computer architectures is being employed.

Data signals D00-D07 from both the MCA bus 14 and the PCA bus 16 are provided to a low byte transceiver circuit 130, which is a bidirectional circuit. The data signals or bus BD0-BD7 from the transceiver 130 are then provided to the computer interface gate array 120, as well as to the JR CPU 122, for data transfers. The data lines BD0-BD7 are considered as the low byte of a 16-bit data path.

Those skilled in the art will understand that the MCA bus 14, being either an 8, 16, or a 32-bit bus, includes at least additional data signals D08-D15. These line are considered the high byte of a 16-bit data path. In a configuration wherein the adapter is operative as a 16-bit bus, the data signals D08-D15 from the MCA bus 14 are provided to a high byte driver 131, which buffers the high data byte to data lines BD08-BD15. The high byte lines BD08-BD15 are provided to a high byte transceiver 132, as well as to a high byte random access memory (RAM) 134. The high byte RAM 134 constitutes part of the triple port RAM, is preferably an 8K by 8 or 32K by 8 static RAM. The RAM 134 is addressed by the address lines MA0-MA7, which are provided as output address lines from the gate array 120. The RAM 134, 136 can be expanded to a total of 64K bytes, if 32K bytes RAM chips are employed.

It will be understood that data for the high byte RAM 134 may originate either from the host bus line D08-D15, or internally via internal data lines MD0-MD7. If data originates on the data lines MD0-MD7, it passes through the high byte transceiver 132. The data lines MD0-MD7 are an internal data bus which is connected between the high byte transceiver 132, the computer interface gate array 120, the low byte RAM 136, and a program read-only memory (ROM) 138. Both the RAM 134, 136, and the ROM 138 may be up to a total of 64K bytes each and are addressed with the address lines MA0-MA7 and BA0-BA7.

Control signals such as clocks, address strobes, memory refresh signals and the like from both the MCA bus 14 and the PCA bus 16 are provided as the signals denominated SYSTEM CONTROL BUS to the computer interface gate array 120. Interrupt request signals such as /IRQA-/IRQD from both the MCA bus 14 and the PCA bus 16 are also provided to the gate array 120.

As will be discussed in greater detail below, the computer interface gate array 120 includes a plurality of data storage registers required for implementing the various 3270 protocol and mainframe communication functions. Accordingly, signals emanating from the computer interface gate array 120 include address lines MA0-MA7, which form a memory address for the memories 134, 136, 138. An address latch 140 buffers the address signals MA0-MA7 and forms a low address comprising signals BA0-BA7, which are provided to the memories.

The gate array also generates MEMORY CONTROL signals for the memories 134, 136, 138. These signals are provided to a memory control programmed logic array (PAL) 142, which provides specific memory control signals for controlling the reading from and writing to the memories.

The JR CPU 122, being a dedicated special purpose computer itself, is able to address memory to access instructions and data in a manner similar to other computers. Accordingly, address signals CA00-CA13 are provided as a bus between the computer interface gate array 120, the JR CPU 122, and a microcode RAM 144a, 144b. The microcode RAM 144 is preferably 8K by 8 static RAM, and provides data buses denominated CD0-CD7 and CD08-CD15.

The RAM 144 is employed for storage of instructions for the JR CPU 122. These instructions are download from a host PC, and configure the JR CPU to operate in one of a plurality of different emulation modes, such as IRMA, PJ, IBM Advanced Adapter, and the like.

A set of option switches 146 are read by the computer interface gate array 120 during the power up cycle. The computer interface gate array 120 enables the switch driver 147 to drive switch information onto the CD0-CD7 bus. When the computer interface gate array 120 is being used in an MCA environment, the input switch information is used to generate alternate adapter ID information. This allows the computer interface gate array to be used in a plurality of different designs, each with a unique identifier. When the computer interface gate array 120 is being used in a PCA environment, the input switch information is used to establish base address locations for resources installed on the adapter. This must be done to ensure that no two devices (the adapter and another peripheral device) share the same address space.

Turning next to FIG. 13, the computer interface gate array circuit 120 is preferably constructed as a custom or semicustom VLSI gate array. The primary functional blocks of the computer interface gate array 120 include a latch circuit 150 which is used to latch in various address information and status information which may be transitory, address multiplexers 152, 153, 157, 158, a configuration register bank 160 for storing information concerning the setup, a peripheral function or emulator register bank 162 for storing information specific to the execution of the adapter's particular function (in this case, terminal emulation), decoder circuits 168, 169, a triple port RAM controller 165, a PC cycle control circuit 170, a switch capture circuit 175, a JR CPU monitor and control circuit 180, and an interrupt control 190.

The configuration register 160 stores configuration data downloaded via a PC DATA BUS. The register includes an MCA configuration register MCA CONFIG 'A' REG, dual purpose MCA and PCA configuration registers MCA & PCA CONFIG 'B' REG and MCA & PCA CONFIG 'C' REG, and an MCA CONFIG 'D' REG.

The incoming address lines A00-A19 are provided to various locations in the circuit 120, including a programmable base address comparator 156. Address lines A00-A12 are provided to the latch circuit 150 for storage of these bits of the address as the latched address signals LA00-LA12. The base address comparator 156 compares the incoming addresses to various base addresses, and provides output signals at the beginning of a bus cycle indicating that a selected base address has occurred on the address bus. The base addresses correspond to addresses in the address space of the host CPU assigned to a particular programming interface.

Output signals from the base address comparator 156 include the signals RAM BASE, ROM BASE, JR BASE, PJ BASE, IRMA BASE, SIRMA BASE, IBM BASE, and GLOBAL REARM BASE. These output signals are provided to the latch 150. The signal denominated RAM BASE occurs when the address on the address lines A00-A19 corresponds to the address PCA SEGMENT or MCA RAM BASE SLCT, depending upon whether PCA mode or MCA mode, respectively, is selected by the select signal PCMDL. A multiplexer 157 selects between these two address segments, depending upon the mode selected. RAM BASE and subsequently PC MEMREQ (from decoder 168) indicates that the triple port RAM 134, 136 has been selected by the host PC for a read or write operation.

Similarly, the comparator 156 provides the signal ROM BASE to the latch 150 in response to comparison between the address lines A00-A19 and an address segment of either PCA ROM BASE SLCT or MCA ROM BASE SLCT. These two address segments are selected by a multiplexer 158, depending on whether PCA or MCA mode is selected by the select signal PCMDL. The ROM BASE signal indicates that the ROM 138 has been selected for a read operation.

The address segments MCA RAM BASE SLCT and MCA ROM BASE SLCT are stored in the register MCA CONFIG 'D' REG in the configuration register bank 160. The address segment PCA SEGMENT is stored in a corresponding register PCA SEGMENT in the bank 160. The segment PCA ROM BASE SCLT is derived from the switch capture circuit 175 and is a function of the settings of the option switches 146. These address segments are set up and stored during system configuration.

Other configuration information stored in the MCA CONFIG 'A' REG register bank 160 includes the MCA CARD ENABLE signal, which is provided to the decoder 156 to indicate that MCA operation has been enabled. The MCA IO BASE SLCT is an address segment indicative of the address region for IO operations in the MCA mode. This address segment is provided to multiplexer 152, which selects between MCA IO BASE SLCT and PCA IO BASE SLCT from the switch capture circuit 175, depending upon whether PCA or MCA mode is operational.

The address segment MCA JR BASE SLCT is also stored in the MCA CONFIG 'A' REG. This address, which corresponds to an address space for operation in the JR mode in an MCA machine, is provided to multiplexer 153, which selects between MCA JR BASE SLCT and PCA JR BASE SLCT from the switch capture circuit 175, again depending upon whether the mode is MCA or PCA.

The outputs of the multiplexers 152, 153 are the address segments IO BASE SELECT and JR BASE SELECT, respectively, which are then compared by the comparator 156 to the instantaneous address on the address bus to detect when one of these address spaces is being chosen for an I/O operation.

Interrupt configuration information is stored in the register MCA & PCA CONFIG 'B' REG in the register bank 160. The signals INT VECT SELECT, INT TYPE, and INT ENABLE signify an interrupt vector, interrupt type, and interrupt enable, respectively. Also stored in this register is a flag to enable operation of the triple port RAM denominated 3 PORT RAM EN, which is provided to the decoder 126.

As previously mentioned, the various terminal emulator modes (e.g. IRMA, PJ, IBM Advanced Adapter, etc.) are implemented with programming in the JR CPU 122. Operation in a selected mode provides a programming interface, as defined above, comprising a predetermined set of parameters, commands, and registers needed by a software driver in the host PC to allow the software driver to effectuate operation in a particular emulator mode. The associated programming interfaces which are operative with the present invention employ resources in the computer interface gate array 120, namely, a group of emulator registers and handshake flags in the register bank 162, and also employ the resources of the triple port RAM controller 165. Each group of registers occupies a portion of the host PC's I/O address map beginning at a predetermined base I/O address when enabled.

Enablement of a particular programming interface is determined by flags in the configuration register 160. The register MCA & PCA CONFIG 'B' REG contains flags for enabling the PJ mode (PJ ENABLE) and the IRMA mode (IRMA ENABLE), while the register MCA & PCA CONFIG 'C' REG contains flags for enabling the IBM Advanced Adapter mode (IBM ENABLE) and the SIRMA mode (SIRMA ENABLE). Related select signals SIRMA BASE SLCT and PJ BASE SLCT are also provided to the decoder 156 to signal when a base address for the SIRMA and PJ modes has been detected on the address bus.

These programming interfaces are selectively enabled via software during system initialization. A particular programming interface is enabled at a particular base address as determined by certain bits in the configuration register bank 160. The programmable base address comparator 156 compares the selected base address for the enabled programming interface to A00-A19 and when the appropriate address range is detected an associated programming interface base signal is asserted (e.g. GLOBAL REARM BASE, IBM BASE, SIRMA BASE, PJ BASE, IRMA BASE, and JR BASE) on lines 159. These signals are subsequently decoded and synchronized with timing signals in the decoder circuit 168 to generate individual register enable signals and strobes for reading and writing specific registers in the emulator register bank 162.

The PCA address bus A00-A19 remains stable throughout the PCA bus cycle. The MCA address bus A00-A19 is not latched throughout the MCA bus cycle and has to be latched by the transparent latch 150 in the computer interface gate array 120. The programming interface base signals 159 generated by the programmable base address comparator 156 are determined in part by the address and they also have to be latched before the address changes. The latched address and the latched programming interface base signals are used by the decoders 168 to generate individual register enable signals for reading and writing specific registers in a particular programming interface which is part of the register bank 162. The transparent latch 150 latches the address and base signals when /ADL asserts during an MCA bus cycle.

The transparent latch 150 remains transparent during a PCA bus cycle as determined by PCMDL.

The output of the latch circuit 150 comprises a plurality of the latched addresses and signals, which are provided to the decoder circuit 168. Also provided to the decoder are read and write signals /RD and /WR from the PC cycle control circuit 170. The decoder 168 is divided into functional blocks shown in FIG. 13 as MCA CONFIG DECODE, PCA SHARED INTERRUPT, IBM & SIRMA DECODE, IRMA & PJ DECODE, JR DECODE, and RAM & ROM DECODE. These functional blocks receive particular latched signals indicative of a certain mode of operation or detection of a particular base address, the /RD and /WR timing signal, and various latched address signals LA0--LA3, and provide output strobe signals on lines 167 to read and write various registers in the register bank 162. The outputs from the latch 150 also include a latched address bus LA00-LA12 to the RAM controller 165, and latched control signals LATCH/S0, LATCH/S1, LATCH/CMD, and LATCH M/IO.

The latches 150 provide the signal LATCH SETUP BASE to the MCA CONFIG DECODE block in the decoders 168, whose output is employed to select certain of the setup registers in the configuration register 160 during system setup.

The PCA SHARED INTERRUPT block in the decoder 168 receives the signal GLOBAL REARM BASE, and provides a /GLOBAL REARM signal defined in the IBM Technical Reference for the Personal Computer AT (IBM Document No. 6183355) to the interrupt control 190.

The IBM & SIRMA DECODE functional block in the decoder 168 receives LATCH IBM BASE and LATCH SIRMA BASE, and provides output strobes to associated registers denominated IBM & SIRMA INTERFACES in the register bank 162.

Similarly, the IRMA & PJ DECODE functional block in the decoder 168 receives LATCH PJ BASE and LATCH IRMA BASE from the latches 150 and provides output strobes to associated registers in the PJ & IRMA INTERFACES registers in the register bank 162.

The JR DECODE functional block in the decoder 168 receives the LATCH JR BASE signal from the latches 150 and provides output signals for directing input/output of the JR processor. These output signals include /JRCS for chip select of the JR processor chip 122, /JRWR as a write signal to the JR chip, and JRA0-JRA3 as register select addresses for the JR chip.

The RAM & ROM DECODE functional block in the decoder 168 receives the LATCH ROM BASE and LATCH RAM BASE signals from the latches 150, and provides an output signal denominated LATCH ALL BASE to the PC cycle control circuit 170, and also read and write control signals PC RD/WR and PC MEM REQ to the triple port RAM controller 165 to signify a memory operation to the triple port RAM. The LATCH ALL BASE signal is to inform PC cycle control 170 that the address on the PC address bus is for this board and that PC cycle control should begin to process a read or write operation, whichever is appropriate. In other words, there has been a base decode for IRMA, PJ, JR or any of the other bases that may be enabled, and the PC cycle control should carry out its function.

The cycle control circuit 170 also receives a LATCH M/IO signal, a LATCH/CMD signal, a LATCH/S1, and a LATCH/S0 signal from the latches 150, and a RAM BUSY signal from the RAM controller 165. The cycle control circuit then provides control signals /RD and /WR for controlling the reading or writing to the registers in the register bank 160, and an MCA/PCA channel ready control signal CHRDY, a direction signal /RDIR, and an enable signal /DBEN, which control the operating mode of transceivers 130 and 131.

It will be recalled from the discussion of FIG. 12 that the lines CD0-CD7 are connected to option switches 146 through switch driver 147. Immediately after a power-on condition, the switch settings are sampled by the computer interface gate array 120 when /RD-SWITCH is asserted. The data is stored inside the switch capture circuit 175.

When the preferred embodiment of the adapter 10 is installed in a PCA bus, the switches 146 define base addresses PCA IO BASE SLCT, PCA ROM BASE SLCT, and the PCA JR BASE SLCT. When installed in an MCA bus, the switches 146 provide an alternate adapter low byte identifier denominated MCA ALT ADPT ID LOW. The adapter ID is a two byte value assigned to each different type of MCA compatible adapter in compliance with the PS/2 Model 50 and 60 Hardware Technical Reference manual published by IBM Corporation.

The gate array circuit 120 further comprises a JR CPU monitor/control circuit 180 which receives signals from the JR CPU 122 denominated /JRRD, /LOWR, CA11-CA13, and CPU CLKIN. By monitoring these signals, the circuit 180 can determine when the JR CPU is accessing memory mapped I/O and triple-port RAM. The triple port RAM controller 165 receives JR RD/WR and JR RAM REQ from the monitor/control circuit 180. This circuit also creates /FWEN which disables the microcode RAMs 144a and 144b when the JR CPU is accessing the gate array 120.

The JR CPU 122 interface timing requirements are not necessarily synchronous with MCA and PCA control and bus timing. Accordingly, the PC cycle control circuit 170 provides JR timing signals denominated JR TIMING to the JR DECODE circuit within the decoders 168. These timing signals, together with LATCH JR BASE, LA3-LA0, /RD, and /WR, develop clock synchronized JR control signals denominated /JRCS, /JRWR, and JRA0-JRA3 to properly sequence the operation of the JR CPU.

The RAM controller 165 is operative to generate appropriate memory control signals on lines 166 for control of the triple port RAM described in connection with FIG. 12. The memory control signals on lines 166 include the signals MA0-MA7, MD0-MD7, /EXTRDY, /PCRDY, SS0, SS1, /DPWR, /DPRD and /LATCH. The RAM BUSY signal is also provided from the RAM controller 165 when a triple port memory operation is under way. The RAM controller 165 is further connected to receive the JR address bus CA0-0-CA11, latched address lines LA00-LA12, and control signals EXT REQ, DAD0, PC RD/WR, JR RAM REQ, JR RD/WR, and PC MEM REQ.

The /EXTRDY is provided for control of an external coprocessor (not shown), which may be employed on the adapter 10. The present invention can support three asynchronous interfaces to the triple port RAM—the host PC, the dedicated JR processor, and a coprocessor, if present. The coprocessor accesses the RAM by activating EXTREQ, which is provided to the RAM controller 165. That signal is synchronized to gate array's clock, and an internal arbitration circuit (not separately shown) determines whether there is time slot available for an external cycle for the coprocessor. If no slot is available, the external processor must wait (it means that the JR circuit or the PC is busy accessing the RAM). When a time slot is available, controller 165 cycles the request and takes /EXTRDY low, and then takes it high. When /EXTRDY goes high, it means that cycle has been completed and any read data should be latched.

Still referring to FIG. 13, an internal PC data bus comprising lines BD0-BD7, which it will be recalled includes the low byte which can be received from the MCA or PCA bus, is provided through bus buffer 182. An internal PC DATA BUS is provided from the bus buffer 182 and connected to the RAM controller 165 as well as to various ones of the registers in the register banks 160 and 162, so as to allow tranfer of data from the host personal computer to various registers.

It will be recalled from the discussion above that the internal microcode RAM 144 may be downloaded from a host personal computer through the data lines BD0-BD7. Data to be downloaded from the host system is transferred through the low byte transceiver 130 (FIG. 12) and applied directly to lines BD0-BD7 of the JR CPU 122. The lines BD0-BD7 form a bidirectional port used to transfer control and download data to and from the JR CPU 122. Download data is steered by logic internal to the JR CPU 122 to either the CD0-CD7 data bus or the CD8-CD15 data bus and thus to its associated RAM 144a or 144b, depending upon an address provided by JRA0-JRA3.

The JR CPU data bus CD0-CD7 is a multi-function bus, and is used to write operational and control information to the associated microcode RAM 144a, to write operational and control information to the computer interface gate array registers 160, 162, and to write operational and control information to the triple port RAM controller 165 as well as the associated RAM 134, 136. Alternatively, the JR CPU data bus CD0–CD7 is used to read instructions and variable data from the low byte microcode RAM 144a, to read operational and control information from various registers within the computer interface gate array 120, to read operational and control information from the triple port memory controller 165 as well as the associated RAM 134, 136, or BIOS ROM 138 if installed.

Still referring to FIG. 13, various of the registers 160 may be accessed by the JR CPU 122 via the JR DATA BUS, through the buffer 176 to the data lines CD0–CD7. These registers are accessible by both the JR CPU 122 as well as a host PC. The registers 160, 162 comprise means for storing operational parameters associated with the implementation of the terminal emulator peripheral function, and can be read from and written to by the host personal computer. Since those skilled in the art will understand that values for various operational parameters are required to implement many peripheral functions in the preferred embodiment such as IRMA, IBM Advanced Adapter, PJ, and other emulator modes, further discussion of the specific functions for these register locations will not be provided. For detailed information on these parameters, the reader is referred to IBM Personal System/2 Model 50 and 60 Technical Reference, IBM document number 80X0902, and the technical reference for the 3270 Advanced Adapter referenced above.

Finally with regard to FIG. 13, an interrupt control circuit 190 is provided for handling the interrupt functions of the preferred adapter board 10. The circuit 190 receives interrupt vector information INT VECT SELECT stored in the register group MCA & PCA CONFIG 'B' in the register bank 160, an interrupt request INT REQ from the IBM & SIRMA programming interface registers in the bank 162, an interrupt request INT REQ from the PJ & IRMA programming interface registers in the bank 162, and /GLOBAL REARM from the decoder 168 associated with the PCA shared interrupt functional block, to effect the assertion and control of interrupts. The output signals /IRQA, /IRQB, /IRQC, and /IRQD from the circuit 190 allow implementation of the interrupt handling capabilities of the adapter.

Next, various signals provided to and from the computer interface gate array 120 will be described. In the following description, the first name is the signal name which is associated with operation in MCA mode, while the parenthetical name of the signal is the signal name associated with operation in PCA mode. As before, slash ("/") before a signal denotes negation or a low-true signal. Those skilled in the art will understand that certain of the signals comprise bus control signals common to both the PCA and the MCA bus architectures, while other signals comprise control signals unique to a particular architecture. Yet other signals described comprise control signals for controlling the communication of data internal to the circuit 30, so that data and instructions communicated from an operatively associated computer system may be routed to appropriate locations in the microcode RAM 144, to and from locations in the display memory 134, 136, to and from registers within the gate array 120, and to and from the JR CPU 122.

The signals CD7–CD0 comprise a tri-state controller data bus which is used by the JR CPU 122 in I/O, instruction fetch, and memory operations. This bus is input by the computer interface gate array 120 during local power up to obtain the current option switch 146 settings located on the adapter. In PCA mode, this data establishes base addresses for resources located on the adapter. In MCA mode, this data establishes adapter ID information used by the host system.

The signal /LOWR corresponds to a JR LOW WRITE STROBE. This signal is asserted by the JR CPU 122 to inform devices that valid data is present on lines CD7–CD0 during JR write cycles.

The signal /JRRD is a read strobe signal is asserted by the JR CPU 122 to inform devices of the type of cycle the JR CPU is currently executing (read or write). This signal remains active (low) at all times unless a write cycle is being performed.

The signal /FWEN is a firmware enable control signal, and is asserted (low) by the gate array 120 to enable the operation of the JR CPU microcode RAMs 144a, 144b. This signal disables the RAM 144 (/FWEN=H) when the gate array is selected for JR I/O.

The signal JR CLKIN is a clock signal used by the gate array 120 to synchronize data transfers between the gate array and the JR CPU 122, and to arbitrate triple port memory timing between a host PC or external coprocessor. This clock is developed by the JR CPU and provided to the JR CPU monitor and control circuit 180 in FIG. 13.

The address lines CA13–CA00 constitute a JR CPU 122 address bus, and represent addresses originating from the JR CPU 122. This bus is monitored by the computer interface gate array 120 to determine when an operation targeted to the computer interface gate array 120 has been requested. CA13 is the most significant bit and CA00 is the least significant bit. The DAD0 output pin of the JR CPU 122 is used to indicate in byte operations whether the low byte is the source/destination (DAD0=L), or the high byte is the source/destination (DAD0=H).

The clock signal SYSCLK is a PCA mode system clock. This signal is used by the gate array 120 in generating interrupt timing which compiles with the IBM shared interrupt protocol. This clock is normally a divide-by-three of the PCA host system oscillator. This input is pulled down through a 30K ohm resistor internal to the gate array and is not used in MCA mode.

The signal /CMD (/IOW) comprises an MCA mode command line or a PCA mode I/O write line. This signal is issued by a MCA type system to initiate processing of a command present on the system's status lines. The signal informs the gate array 120 that a request may be beginning (or ending). In PCA mode, this pin is used to input /IOW (I/O write) from the host PC and inform the gate array that an I/O write cycle is currently taking place. In either mode, this signal is active low.

The signal M/IO (/IOR) constitutes an MCA mode memory I/O status or a PCA mode I/O read line. The signal is driven by an MCA type system to indicate to slave devices that the current cycle is for memory devices (M/IO=H) or I/O devices (M/IO=L). In PCA mode, the signal is used to input /IOR (I/O read) from the host PC and inform the gate array 120 that an I/O read cycle is currently taking place.

The signal /S1 (/MRD) comprises an MCA mode status bit 1, or a PCA mode memory read command signal. This signal identifies the type of cycle to be performed in microchannel mode (in conjunction with /S0). In PCA mode this signal is issued by the host PC to request a memory read cycle (active low).

The signal /S0 (/MWR) comprises an MCA mode status bit 0 signal, or a PCA mode memory write command signal. This signal identifies the type of cycle to be performed in MCA mode (in conjunction with /S1). In PCA mode, this signal is issued by the host PC to request a memory write cycle.

The signal /CDSETUP (AEN) comprises an MCA mode card setup control signal, or a PCA mode address enable status bit. This signal is asserted by an MCA system to place the card in setup mode (initialization of programmable option selects). In PCA mode, this signal is issued by the host PC to indicate whether or not the current address on the bus is valid or should be ignored.

The address lines A00-A19 comprise a host system address bus (MCA or PCA). The address bus is active high.

The signal ROMINST comprises a ROM installed status bit. This status line can be read by the JR CPU 122 to determine whether or not an extended BIOS ROM is installed on the adapter card as the ROM 138. Additionally, this bit will enable (if H) or disable (if L) internal decoders for selection of the ROM 138. This signal requires an external pullup resistor if ROM cycles are to be enabled.

The signal /ADSEL comprises an address selected status bit. This line is used to inform the gate array 120 whether or not the current address on the address bus is over or under 1 megabyte. It is generally formed by a decode of address bits 20-23 and will inhibit the gate array if inactive (H), or enable the gate array if active (L). This line prevents aliasing of the gate array in a system operating with greater than 1 megabyte of address space.

The signal /CDSFDBK comprises an MCA mode card selected feedback signal. This line is activated in response to a MCA based system generating a valid slave address. This signal is used to inform the host that a card is present on the bus.

The signal /CDDS16 is an MCA mode 16 bit data select. This line is activated by the gate array 120 in response to a valid triple port RAM base being detected. The MCA system uses this bit to control whether 16 bits of data are to be transferred in a single bus cycle or 8 bits of data are to be transferred.

The signal /ADL (ALE) comprises an MCA mode address latch control signal and a PCA mode address latch enable. In the MCA mode, this input is used to latch A00-A12, /S0, /S1, /CDSETUP, M/IO, /CMD, RAM BASE, ROM BASE, IBM BASE, IRMA BASE, PJ BASE, SIRMA BASE, and GLOBAL REARM BASE values into the latches 150. In PCA mode, this line is used to latch the status of /ADSEL. In MCA mode, the address latches are transparent when /ADL is high. In PCA mode, the latch for /ADSEL is transparent when /ADL is high.

The signal /RST is a reset signal. This input is used to reset the configuration register bank 160 to prepare for host system initialization without disturbing the JR CPU interfaces and triple port memory control. A 3270 session will not be broken by asserting this line.

The signal /LRST is a local reset signal. This input is used to reset the JR CPU interfaces and the triple port memory control. A 3270 session will be terminated when this signal becomes active. Taking /RST and /LRST simultaneously active and then inactive will bring the gate array 120 up from a cold start.

The signal /MEMSC16 is a PCA mode memory size status bit. In PCA mode, this signal may be asserted to inform the host CPU that the memory selected is 16 bits wide. The gate array 120 may assert this line when a valid RAM base address has been detected.

The signal CHRDY is a card "channel ready" status signal. This signal is generated by the gate array 120 to signal the host CPU that the requested operation is currently complete (H) or not complete (L). The host CPU inserts wait states in the current bus cycle until the gate array responds with channel ready status. The gate array 120 will complete any operation within 1.8 microseconds.

The signal PCMDL is a PC mode status bit. This signal is used by the gate array 120 to establish its current operating mode, MCA or PCA. When this signal is high, PCA mode is configured. When this signal is low, MCA mode is configured.

The signal /IRQD is the MCA mode interrupt request D, or PCA mode interrupt status for /IRQB. In MCA mode, this pin is an interrupt request output. In PCA mode, this pin is an input for obtaining the status of interrupt channel "B" (/IRQB) to support the IBM interrupt sharing protocol.

The signal /IRQC is the MCA mode interrupt request C, or the PCA mode interrupt status for /IRQA. In MCA mode, this pin is an interrupt request output. In PCA mode, this pin is an input for obtaining the status of interrupt channel "A" (IRQA) to support the IBM interrupt sharing protocol.

The signal /IRQB is the interrupt request B signal. This signal is asserted by the gate array 120 to initiate interrupt service for a level "B" interrupt.

The signal /IRQA is the interrupt request A signal. This signal line is asserted by the gate array 120 to initiate interrupt service for a level "A" interrupt.

The signal /RDIR is a data transceiver direction control signal. This signal is asserted by the gate array 120 to indicate that a read operation is in process by the host system CPU, and that the gate array is going to drive data outbound. Moreover, the signal is used for controlling the direction of an external data bus buffer. /RDIR is low for host system reads, high for host system writes.

The signal /DBEN is a data transceiver enable control signal. This signal is asserted by the gate array 120 to indicate that data is to be passed either to or from the host PC system and that the external data transceiver should be enabled. /DBEN is active low (to enable the external transceiver).

The data bus lines BD0-BD7 comprise a host data bus. These eight lines form a bidirectional data bus for communicating data to and from the host PC (MCA or PCA) and the gate array 120. This bus may contain memory or I/O data going to or coming from the gate array. The BD bus is active high.

The signal /186INTOUT comprises an interrupt input signal for an intelligent coprocessor (now shown). As a specific example, when the SUPER-IRMA terminal emulation mode (SIRMA) is implemented using the present invention, the host PC will set a status bit in the register bank 160 to cause the assertion of this signal.

This in turn informs the intelligent coprocessor (if present) that the host PC needs attention.

The signal /186INTIN comprises an intelligent coprocessor interrupt request input signal. This signal is used to input an interrupt request to the computer interface gate array 120 from an intelligent coprocessor requesting service from the host PC. This line when pulsed (with interrupts enabled) causes /IRQA, /IRQB, /IRQC, or /IRQD (whichever is selected) to be asserted and a "186 interrupt request" status to be available in an interrupt status register INTERRUPT STAT REG in the emulator register bank 162. An intelligent coprocessor should pulse this line low, then release it to generate a host system interrupt.

The signal /EXTRDY is an external memory request ready status signal. This signal line is cycled by the gate array 120 to inform an intelligent coprocessor that a requested external memory cycle has been completed. When active (low), this line makes "transparent" any external latches/drivers associated with the intelligent coprocessor's data bus (not shown). When high, data read from the RAM 134, 136 is latched and a status bit is set to indicate completion of the external cycle.

The signal /EXTREQ is an external memory cycle request. This signal line is sampled by the RAM controller circuit 165 within the gate array 120 to determine if an external memory cycle has been requested. If requested, the gate array will execute the external cycle in the next available time slot, and cycle /EXTRDY when complete. External memory requests have the lowest priority. External requests can occur asynchronously with the 18 MHz clock.

The signal B18 MHz is a clock signal, and is used by the gate array 120 to control most functions and timing. Additionally, it is used to resolve metastability issues between the JR CPU 122 (if run asynchronously with the gate array), an external coprocessor, and memory control.

The signal /RDSWITCH signifies read the configuration switches 146. This output is activated by the gate array 120 after local reset (/LRST) has gone active, then inactive. When /RDSWITCH is active (low), configuration switch data is captured into the gate array through the lines CD0-CD7. /RDSWITCH returns to its inactive (high) state after switch information is input.

The data lines MD7-MD0 comprise a triple port RAM memory data bus. This memory data bus is a bidirectional bus used for transferring data between the JR CPU 122 and triple port RAM 134, 136, or between the host PC system CPU and the triple port RAM. This bus is always tristate unless the gate array 120 is writing to triple port RAM or the triple port RAM is driving data to the gate array.

The signal /PCRDY is a PC ready strobe signal. This output is used to control the latching of any high byte driver/latches employed in a 16 bit interface bus of the host CPU during triple port read cycles. When this signal is active (low), the external latches should be made transparent. When this signal is inactive (high), the external high byte data should be latched. In host PCs employing the disclosed embodiment, data needs to be latched since the memory control state machine does not wait for acknowledgement from the host CPU that a cycle is complete (i.e., there is no response to host deactivation of /CMD or /MRD).

The signal /DPWR is a triple port RAM write strobe signal. This output is used to store data on bus lines MD0-MD7 into the triple port RAM 134, 136 during a host PC or JR CPU cycle. It is directly connected to the /WE (write enable) inputs of RAM devices. During externally requested cycles (from an intelligent coprocessor, if present), both /DPWR and /DPRD are active (low) simultaneously and are employed to generate correct RAM timing and synchronization.

The signal /DPRD is a triple port RAM read strobe signal. This output is used to enable the output of the RAM devices 134, 136 during a host PC or JR CPU cycle. It is directly connected to the /OE input of RAM devices. During externally requested cycles (from an intelligent coprocessor, if present), both /DPWR and /DPRD are active (low) simultaneously and are employed to generate correct RAM timing and synchronization.

The signal /LATCH is a lower address latch or strobe signal. This output is used to control latching of a 74LS373 type device used for demultiplexing the MA0-MA7 address bus. When /LATCH is high, the LSB of address will be output on the MA bus. /LATCH goes low (active) to capture the LSB of the memory address. /LATCH is also used to enable the decode of the status bits SS0 and SS1 in determining the type of cycle being requested.

The signals SS1, SS0 are triple port RAM control status/command bits 0 and 1. These outputs are used by the memory control PAL 142 to determine gating and data path control for the current cycle being processed. Their encodings are as follows:

| SS0 | SS1 | Cycle Type |
|---|---|---|
| L | L | JR CPU RAM cycle |
| L | H | MCA/PCA/JR ROM cycle |
| H | L | MCA/PCA RAM cycle |
| H | H | external cycle |

The signals JRA0-JRA3 comprise JR interface bus address bits 0-3. These outputs are used to address one of fourteen specific registers within the JR CPU 122 from the host CPU for reading or writing.

The signal /JRCS is a JR chip select line. This output is used for selecting the JR CPU internal registers for reading or writing, or downloading the microcode RAM 144.

The signal /JRWR is a JR write control line. This output is used to inform the JR CPU 122 that the currently addressed port (via the JR interface bus address) is to be written to (/JRWR active) or read from (/JRWR inactive).

The address lines MA7-MA0 comprise a triple port memory address bus. These outputs form a multiplexed address bus for the triple port RAM 134, 136. When /LATCH is inactive (high), this bus reflects the least significant byte of address to be used in triple port memory cycles; after /LATCH becomes active, this bus switches and becomes the most significant byte of address to the triple port RAM. The demultiplexed MA bus thus forms a 16 bit address and allows for a maximum of 64K bytes for triple port RAM 134, 136 or ROM 138.

Turning now to FIG. 14, the JR CPU 122 is essentially a dedicated microprocessor for carrying out 3270 communications functions. The processor 122 may be considered as having three basic ports—an external data port, a CPU interface, and an encoder/decoder port. The external data port comprises the data signals BD0-BD7, the register address lines JRA0-JRA3, a chip select line /JRCS, a write strobe line /JRWR, an interrupt request line /IRPT, and a reset line RESET. The CPU interface comprises the data lines CD0-CD15, address lines CA0-CA13, a read signal/RD, a low byte write signal /LOWR and /HIWR, and a clock out signal CLK OUT (which becomes the clock signal JR CLKIN). The encoder/decoder interface communicates the 3270 protocol to the analog interface 40, and comprises the signals /DATA, DATA−1, TA, and RCVD.

From the foregoing, those skilled in the art will now understand that there has been disclosed a peripheral interface adapter 10 operative in a plurality of different computer system bus architectures, especially, the PCA and the MCA. The adapter comprises peripheral function circuit means for carrying out a peripheral function for either a PCA or an MCA computer system, depending upon the system with which the peripheral interface adapter is operatively associated. The peripheral function in the disclosed embodiment is a terminal emulator.

The terminal emulation function in the adapter 10 is implemented by programming the JR CPU 122 to carry out protocol conversion and communications via the analog interface 40 over the communications connectors 24, 25. It will now be understood that the JR CPU 122 comprises a dedicated programmable data processor implemented in VLSI, and that the preferred embodiment includes program memory means for storing instructions for the CPU. The preferred program memory means comprises the microcode RAM 144, and is operative to receive and store downloaded instructions from the PC.

The card select address decoder 126 is used in the MCA environment to decode the four most significant bits of host address and output signal /ADSEL to the computer interface gate array 120 when those four bits are zero (operation below one megabyte range) and signal PCMDL is a logic zero (signifying MCA environment). This enables logic within the computer interface gate array 120 to respond if required to the host PC but disables responses from the computer interface gate array 120 if the host PC address is over one megabyte to prevent aliasing.

When in the PCA environment, output signal /ADSEL from the card select address decoder 126 is forced to a logic low state by detection of a logic high on signal PCMDL (signifying the PCA environment).

Accordingly, it will be appreciated that the bus architecture identification signal, PCMDL, and its supporting structure comprises means for detecting whether the PCA connector or the MCA connector is plugged into a computer bus, and constitutes a signal corresponding to the detection of either the PCA or the MCA. The VLSI gate array 120 implements a bus interface circuit means connected to both the PCA edge contacts 16 and the MCA edge contacts 14, which receives and transmits instructions or data from an operatively associated computer system. It will be appreciated that the gate array 120 includes a common circuit for executing computer interface functions common to both the MCA bus architecture and the PCA bus architecture, as well as a first bus circuit for executing functions unique to the PCA architecture and a second bus circuit for executing functions unique to the MCA bus architecture. Furthermore, the gate array 120 is responsive to the PCMDL signal for enabling operation of either the PCA bus circuit or the MCA bus circuit, whichever is detected as operative.

The provision of the common circuitry for both supported architectures is considered a particular advantage of the present invention, since it results in savings in component counts and usage of board space. Since both supported computer bus architectures include an address bus, a data bus, and a plurality of common control signals, the VLSI gate array 120 efficiently implements an address decoder responsive to address signals from the address bus of either architecture for detecting when said peripheral adapter 10 has been addressed by an operatively associated computer system. The gate array provides signals to control the data path from both PCA and MCA buses, to the JR CPU 122, the microcode RAM 144, and the display memory 134, 136. The gate array 120 therefore comprises control signal means responsive to a plurality of common control signals, as well as control signals unique to the MCA or the PCA, and to the bus architecture identification signal PDMDL, for carrying out interface functions common to both bus architectures as well as unique to each architecture individually.

The gate array 120 is also employed to implement a plurality of data registers for storing operational parameters associated with the execution of the peripheral function by the JR CPU 122. It will be appreciated that the data registers are accessible by the JR CPU via the internal data bus lines CD0-CD7, which also allows data communication with the associated PC.

While this invention has been described in detail with particular reference to preferred embodiments thereof, it will be understood that variations and modifications can be effected within the scope of the invention as described hereinbefore and as defined in the appended claims.

What is claimed is:

1. An adapter board operative with either of two discrete computer bus architectures, comprising:
   a main adapter board;
   first bus connector means associated with said main adapter board for connecting said board to a first one of said computer bus architectures;
   second bus connector means associated with said main adapter board for connecting said board to the second of said computer bus architectures;
   external connector means for enabling said board to be connected to a device located off said board, said external connector means being movable between a first position with respect to said board and a second postion with respect to said board;
   whereby said main adapter board may be used with either of said computer bus architectures and said external connector means may be positioned in a manner compatible with the computer bus architecture to which said board is connected.

2. The adapter board of claim 1, wherein in said first position said external connector means extends above the plane of a first side of said main adapter board, and in said second position extends above the plane of a second side of said main adapter board.

3. The adapter board of claim 1, wherein said first and second bus connector means comprise edge connectors along opposite edges of said main adapter board, said edge connectors being adapted to be received in respective sockets associated with the respective computer bus architectures.

4. The adapter board of claim 3, wherein said main adapter board is rectangular in shape and has an axis of symmetry parallel to the edges carrying said edge connectors, and wherein in said first position said external connector means is positioned on one side of said axis of symmetry of said board, and in said second position said external connector means is positioned on the opposite side of said axis of symmetry.

5. The adapter board of claim 4, wherein in said first position said external connector means extends above the plane of a first side of said main adapter board, and in said second position extends above the plane of a second side of said main adapter board.

6. The adapter board of claim 1, wherein said external connector means is mounted on a removable section of said main adapter board, said section being received by said board in either of two orientations so as to place said external connector means in either said first or said second position.

7. The adapter board of claim 6, wherein said removable section includes circuit means for connecting said external connector means to said main adapter board in either of said orientations of said section.

8. The adapter board of claim 7, wherein said main adapter board includes a removable section terminal; and wherein said circuit means of said removable section includes a pair of mating terminals, one of which engages said removable section terminal in each of said orientations of said removable section.

9. The adapter board of claim 8, wherein said main adapter board slidably receives said removable section in each of said two orientations, and wherein sliding motion of said removable section with respect to said main adapter board engages or disengages said removable section terminal with or from said mating terminals on said removable section.

10. The adapter board of claim 9, wherein said first computer bus architecture is a PCA; said first bus connector means comprises an edge connector along a first edge of said main adapter board compatible with PCA; said second computer bus architecture is an MCA; and said second bus connector means comprises an edge connector along a second edge of said main adapter board opposite said first edge compatible with MCA.

11. The adapter board of claim 1, wherein said external connector means is selected from the group consisting of an RJ-11 interface connector and a coaxial interface connector.

12. The adapter board of claim 10, wherein said external connector means on said removable section includes both an RJ-11 interface connector and a coaxial interface connector, such that in one orientation of said removable section said RJ-11 connector is in said first position and said coaxial connector is in said second position, and in the other orientation of said removable section said coaxial connector is in said first position and said RJ-11 connector is in said second position.

13. The adapter board of claim 12, wherein said main adapter board and said removable section have a common axis of symmetry, and wherein said RJ-11 and coaxial connectors are positioned on said removable section on opposite sides of said axis of symmetry.

14. The adapter board of claim 13, wherein said RJ-11 and coaxial connectors change positions with respect to said axis of symmetry when said removable section is moved from one orientation to the other.

15. The adapter board of claim 14, wherein in one orientation of said removable section said external connector means extends above the plane of a first side of said main adapter board, and in the other orientation of said removable section said external connector means extends above the plane of a second side of said main adapter board.

16. An adapter board capable of operation with either a PCA computer bus architecture or alternately with an MCA computer bus architecture, comprising:
a main adapter board;
a first edge connector positioned along a first edge of said main adapter board for being received in a socket compatible with said PCA architecture;
a second edge connector positioned along a second edge of said main adapter board for being received in a socket compatible with said MCA architecture, said first and second edges being parallel, and said main adapter board having an axis of symmetry parallel to said first and second edges; and
external connector means selected from the group consisting of RJ-11 interface connector and coaxial interface connector for enabling said main adapter board to be connected to a device located off said main adapter board, said external connector means being mounted on a removable section of said main adapter board, said removable section being received by said main adapter board in either of two orientations so as to place said external connector means in either a first position in which said external connector means is on a first side of said axis of symmetry and extends above the plane of a first side of said main adapter board, or a second position in which said external connector means is on a second side of said axis of symmetry and extends above the plane of a second side of said main adapter board;
said removable section including circuit means for connecting said external connector means to a removable section terminal on said main adapter board in either of said two orientations of said removable section;
whereby said main adapter board may be used with either of said computer bus architectures and said external connector means may be positioned in a manner compatible with the computer bus architecture to which said board is connected.

17. The adapter board of claim 16, wherein said main adapter board slidably receives said removable section in each of said two orientations, and wherein sliding motion of said removable section with respect to said main adapter board engages or disengages said removable section terminal with or from said circuit means on said removable section.

18. The adapter board of claim 17, wherein said external connector means on said removable section includes both an RJ-11 interface connector and a coaxial interface connector mounted on opposite sides of said axis of symmetry, such that in one orientation of said removable section said RJ-11 connector is in said first position and said coaxial connector is in said second position, and in the other orientation of said removable section said coaxial connector is in said first position and said RJ-11 connector is in said second position.

19. The adapter board of claim 16, wherein said removable section is slidably received by said main adapter board.

20. A computer adapter board, comprising:
a main circuit board;
external connector means for enabling said board to be connected to a device located off said board;
said external connector means being mounted on a removable section of said main board, said section being received by said board in either of two orientations so as to place said external connector means in either a first or a second position.

21. The adapter board of claim 20, wherein said removable section includes circuit means for supplying an identical electrical connection between said external connector means and a removable section terminal of said main circuit board in either of said orientations of said section.

22. The adapter board of claim 21, wherein said circuit means of said removable section includes a pair of mating terminals, one of which engages said removable section terminal in each of said orientations of said removable section.

23. The adapter board of claim 20, wherein in said first position said external connector means extends above the plane of a first side of said main circuit board, and in said second position extends above the plane of a second side of said main circuit board.

24. A computer adpater board, comprising:
a main circuit board; and
external connector means for enabling said board to be connected to a device located off said board;
said external connector means being mounted on a removable section of said main board, wherein said removable section is slidably received by said main board in either of two orientations so as to place said external connector means in either a first or a second position.

25. The adapter board of claim 24, wherein said removable section includes circuit means for connecting said external connector means to said main circuit board in either of said orientations of said section.

26. The adapter board of claim 25, wherein said main board includes a removable section terminal; and wherein said circuit means of said removable section includes a pair of mating terminals, one of which engages said removable section terminal in each of said orientations of said removable section.

27. The adapter board of claim 26, wherein the sliding motion of said removable section with respect to said main board engages or disengages said removable section terminal with or from said mating terminals on said section.

28. The adapter board of claim 24, wherein in said first position said external connector means extends above the plane of a first side of said main circuit board, and in said second position extends above the plane of a second side of said main circuit board.

29. A computer adapter board, comprising:
a main circuit board including a removable section terminal; and
external connector means for enabling said board to be connected to a device located off said board;
said external connector means being mounted on a removable section of said main board, said section being slidably received by said board in either of two orientations so as to place said external connector means in either a first position or a second position;
said removable section including circuit means for connecting said external connector means to said main circuit board in either of said orientations of said section, said circuit means including a pair of mating terminals, one of which engages said removable section terminal in each of said orientations of said removable section;
wherein the sliding motion of said removable section with respect to said main board engages or disengages said removable section terminal with or from said mating terminals on said section.

* * * * *